United States Patent
Funabashi et al.

(10) Patent No.: US 6,580,740 B2
(45) Date of Patent: Jun. 17, 2003

(54) SEMICONDUCTOR LASER DEVICE HAVING SELECTIVE ABSORPTION QUALITIES

(75) Inventors: Masaki Funabashi, Tokyo (JP); Ryosuke Yatsu, Tokyo (JP); Akihiko Kasukawa, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 14 days.

(21) Appl. No.: 09/906,842

(22) Filed: Jul. 18, 2001

(65) Prior Publication Data

US 2003/0016720 A1 Jan. 23, 2003

(51) Int. Cl.[7] ................................................ H01S 5/00
(52) U.S. Cl. ............................. 372/50; 372/45; 372/46; 372/96; 372/20
(58) Field of Search .......................... 372/11, 96, 39–50, 372/127

(56) References Cited

U.S. PATENT DOCUMENTS

| | | | | |
|---|---|---|---|---|
| 4,509,175 A | * | 4/1985 | Daly et al. .................... 372/101 |
| 4,888,783 A | * | 12/1989 | Kojima et al. ................. 372/26 |
| 4,976,513 A | * | 12/1990 | Numai ........................ 359/558 |
| 5,138,624 A | * | 8/1992 | Hong et al. .................... 257/14 |
| 5,220,573 A | * | 6/1993 | Sakata et al. ................. 372/102 |
| 5,383,213 A | * | 1/1995 | Irikawa et al. ................. 372/45 |
| 5,416,866 A | * | 5/1995 | Sahlen ........................ 385/131 |
| 5,441,912 A | * | 8/1995 | Tsukiji et al. ......... 148/DIG. 95 |
| 5,459,747 A | * | 10/1995 | Takiguchi et al. ............ 372/102 |
| 5,539,763 A | * | 7/1996 | Takemi et al. ................. 372/26 |
| 5,757,832 A | * | 5/1998 | Uchida ........................ 372/106 |
| 5,789,765 A | * | 8/1998 | Nishikata et al. ............ 257/103 |
| 5,870,213 A | * | 2/1999 | Ishikawa et al. ............. 359/135 |
| 5,881,086 A | * | 3/1999 | Miyazawa ................... 359/156 |
| 5,889,805 A | * | 3/1999 | Botez et al. ................... 372/45 |
| 5,926,497 A | * | 7/1999 | Nitta et al. .................. 372/102 |
| 5,987,046 A | * | 11/1999 | Kobayashi et al. ............ 372/45 |
| 6,238,943 B1 | * | 5/2001 | Kobayashi et al. ............ 372/45 |

FOREIGN PATENT DOCUMENTS

JP            406224517        *    8/1994           ............. H01S/3/18

* cited by examiner

Primary Examiner—Paul Ip
Assistant Examiner—Tuan Nguyen
(74) Attorney, Agent, or Firm—Oblon, Spivak, McClelland, Maier & Neustadt, P.C.

(57) ABSTRACT

A semiconductor laser device includes a semiconductor substrate, an active region formed on the semiconductor substrate and configured to radiate light having a predetermined wavelength range, and a wavelength selecting structure configured to select a first portion of the radiated light for emitting from the semiconductor laser device. An absorption region is located in a vicinity of the active region and configured to selectively absorb a second portion of the radiated light, and the first portion of the radiated light has a different wavelength than the second portion of the radiated light. The absorption region may be an integrated diffraction grating or a selective absorption region of the laser device. The semiconductor laser device may be used in an optical fiber amplifier such as a raman amplifier, a wavelength division multiplexing system, or a semiconductor laser module.

83 Claims, 15 Drawing Sheets

SEMICONDUCTOR LASER DEVICE HAVING SELECTIVE ABSORPTION QUALITIES

BACKGROUND OF THE INVENTION

1. Field of the Invention

The present invention relates generally to semiconductor laser devices, and more particularly to a semiconductor laser device that selectively absorbs a portion of the light radiated from an active layer of the semiconductor laser device.

2. Discussion of the Background

With the recent demand for increased bandwidth for data communications, optical networks and the components essential for their operation are being closely studied. To provide a light source for such optical networks, semiconductor laser devices such as the distributed feedback (DFB) semiconductor laser device, the distributed Bragg reflector (DBR) semiconductor laser device, and the fiber Bragg grating (FBG) semiconductor laser module, or the like have been used. Each of these devices include a wavelength selecting structure capable of selecting a lasing wavelength independent of the optical gain distribution of the active layer and emitting the selected wavelength from the laser device.

For example, FIG. 13 shows a cross section of an exemplary distributed feedback semiconductor laser 1300 (hereinafter, referred to as a DFB laser). As seen in this figure, the DFB laser has an active layer 1301 wherein radiative recombination takes place, and a diffraction grating 1303 for changing the real part and/or the imaginary part of the refractive index (complex refractive index) periodically, so that only the light having a specific wavelength is fed back for wavelength selectivity. The diffraction grating 1303 is comprised of a group of periodically spaced parallel rows of grating material 1305 surrounded by a cladding material 1307 (typically made of InP material) to form a compound semiconductor layer that periodically differs in refractive index from the surroundings. In a DFB laser having such a diffraction grating 1303 in the vicinity of its active layer 1301, the lasing wavelength $\lambda_{DFB}$ which is emitted from the DFB laser is determined by the relation:

$$\lambda_{DFB} = 2 n_{\it eff} \Lambda,$$

where $\Lambda$ is the period of the diffraction grating as shown in FIG. 13, and $n_{\it eff}$ is the effective refractive index of the waveguide. Thus, the period $\Lambda$ of the diffraction grating and the effective refractive index $n_{\it eff}$ of the waveguide can be adjusted to set the lasing wavelength $\lambda_{DFB}$ independent of the peak wavelength of the optical gain of the active layer.

This setting of the lasing wavelength $\lambda_{DFB}$ independent of the peak wavelength of the optical gain of the active layer allows for essential detuning of the DFB laser device. Detuning is the process of setting the emitted lasing wavelength of a laser to a different value than the peak wavelength of the optical gain of the active layer to provide more stable laser operation over temperature changes. As is known in the art, a larger detuning value (that is, a large wavelength difference between the emitted lasing wavelength and the peak wavelength of the optical gain of the active layer) can improve high speed modulation or wide temperature laser performance.

In addition to detuning, the lasing wavelength $\lambda_{DFB}$ may also be set independent of the peak wavelength of the optical gain of the active layer in order to the obtain different characteristics of the semiconductor laser device. For example, when the lasing wavelength of the DFB laser is set at wavelengths shorter than the peak wavelength of the optical gain distribution, the differential gain increases to improve the DFB laser in high-speed modulation characteristics and the like. Where the lasing wavelength of the DFB laser is set approximately equal to the peak wavelength of the optical gain distribution of the active layer, the threshold current of the laser device decreases at room temperature. Still alternatively, setting $\lambda_{DFB}$ at wavelengths longer than the peak wavelength improves operational characteristics of the DFB laser, such as light intensity output and current injection characteristics, at higher temperatures or at a high driving current operation. It is noted, however, that where the lasing wavelength $\lambda_{DFB}$ is set shorter or longer than the peak wavelength of the optical gain distribution of the active layer, undesirable lasing may actually occur at the peak wavelength of the optical gain distribution of the active layer. Thus, the peak wavelength is generally suppressed in order to optimize the emitted light at the lasing wavelength.

The conventional DFB laser such as that disclosed in FIG. 13 can be broadly divided into a refractive index coupled type laser and a gain coupled type laser. In the refractive index coupled DFB laser, the compound semiconductor layer constituting the diffraction grating has a bandgap energy considerably higher than the bandgap energy of the active layer and the bandgap energy of the lasing wavelength. Thus, bandgap wavelength (which is a wavelength conversion of the bandgap energy) of the diffraction grating is typically at least 100 nm shorter than the lasing wavelength and is usually within the range of 1200 nm–1300 nm if the $\lambda_{DFB}$ is approximately 1550 nm. In the gain coupled DFB laser, the bandgap wavelength of the compound semiconductor layer constituting the diffraction grating is longer than the lasing wavelength and is typically about 1650 nm if the $\lambda_{DFB}$ is approximately 1550 nm. FIGS. 14a and 14b show the operational characteristics of an exemplary refractive index coupled laser and gain coupled laser respectively. Each of these figures includes $\lambda$e, $\lambda$g, $\lambda$max, and $\lambda$InP shown plotted on an abscissa which shows wavelength increasing from left to right in the figures. In this regard, $\lambda$e is the selected lasing wavelength of the DFB laser 1300, $\lambda$max is the peak wavelength of the optical gain distribution of the active layer 1301, $\lambda$g is the bandgap wavelength of the diffraction grating material 1305, and $\lambda$InP is the bandgap wavelength of the surrounding InP material 1307. As seen in FIGS. 14a and 14b, the bandgap wavelength $\lambda$InP is typically 920 nm and the bandgap wavelength $\lambda$g is closely related to the absorption loss of the diffraction grating which is shown by the broken curves 1403 and 1403'. Moreover, the refractive index of a material increases as the bandgap wavelength of the material increases as shown by the arrows 1405. Thus, as seen in the figures, the refractive index of the diffraction grating having the bandgap wavelength $\lambda$g is generally higher than the refractive index of the surrounding InP layer having the bandgap wavelength $\lambda$InP.

FIG. 14a shows an exemplary refractive index coupled DFB laser wherein the lasing wavelength $\lambda$e which is greater than the bandgap wavelength $\lambda$g of the diffraction grating layer. Specifically, the DFB laser has a lasing wavelength $\lambda$e of 1550 nm, has a bandgap wavelength $\lambda$g of 1250 nm, and satisfies the relationship:

$$\lambda g < \lambda \max < \lambda e.$$

Thus, the DFB laser of FIG. 14(a) reflects $\lambda$e–$\lambda$g=300 nm. With the refractive index coupled DFB laser, the absorption loss curve 1403 does not cross the lasing wavelength $\lambda$e and therefore absorption loss at $\lambda$e is very small. Accordingly, the DFB laser of FIG. 14a, has the advantage of a low threshold current and favorable optical output-injection current characteristics. However, as also shown in FIG. 14a, in a refractive index coupled DFB laser, the absorption loss curve 1403 also does not cross the peak wavelength of the optical gain distribution of the active layer $\lambda$max. Therefore, assuming that the absorption coefficient with respect to the lasing wavelength $\lambda$e of the DFB laser is $\lambda$e and the absorption coefficient with respect to the bandgap wavelength of the active layer, or the peak wavelength $\lambda$max of the optical gain distribution of the active layer, is $\alpha$max, then $\alpha$e is approximately equal to $\alpha$max which is approximately equal to zero. This means that the absorption curve 1403 affects neither $\lambda$max nor $\lambda$e, and the peak wavelength $\lambda$max of the optical gain distribution of the active layer is not suppressed with respect to the lasing wavelength $\lambda$e.

More specifically, there is a problem with the refractive index coupled laser in that a side mode suppression ratio (SMSR) of adequate magnitude cannot be secured between the lasing mode at the designed lasing wavelength $\lambda$e of the DFB laser and the mode around the peak wavelength $\lambda$max of the optical gain distribution of the active layer. In addition, because neither the $\lambda$max nor the $\lambda$e wavelengths are affected by the absorption curve 1403, wide detuning cannot be accomplished using the refractive index coupled semiconductor laser of FIG. 14a. That is, the absolute value of the detuning amount $|\lambda e - \lambda max|$ cannot be made greater since an increase in the absolute value of the detuning amount $|\lambda e - \lambda max|$ would result in a large gain difference between the lasing wavelength $\lambda$e and $\lambda$max, and lowers the single mode properties and narrows the temperature range operation of the refractive index coupled semiconductor laser.

Finally, with the refractive index coupled DFB laser of FIG. 14a, the difference in the refractive index of the grating material 1305 and the refractive index of the InP buried layer 1307 is relatively small. Therefore, the physical distance between the grating material 1305 and the active layer 1301 of the DFB laser 1300 must be reduced and, as a result, the coupling coefficient varies greatly depending on the thickness of the diffraction grating layer and the duty ratio which is expressed as W/$\Lambda$, where W is the width of one element of the diffraction grating and $\Lambda$ is the pitch of the gratings. This makes it difficult to fabricate refractive index DFB laser devices having the same characteristics resulting in low manufacturing yields for this type of laser.

As seen in FIG. 14b, the gain coupled DFB laser has a lasing wavelength $\lambda$e of which is less than the bandgap wavelength $\lambda$g of the diffraction grating layer. Specifically, the DFB laser of FIG. 14b has a lasing wavelength $\lambda$e of 1550 nm, a bandgap wavelength $\lambda$g of 1650 nm, and satisfies the relationship:

$$\lambda max < \lambda e < \lambda g.$$

Thus, this exemplary DFB laser reflects $\lambda e - \lambda g = -100$ nm. In the gain coupled DFB laser of FIG. 14b, there is a relatively large difference between the refractive index of the grating material 1305 and refractive index of the InP buried layer 1307 which makes it possible to increase the distance between the grating material 1305 and the active layer 1301. As a result, unlike the refractive index coupled DFB laser, the coupling coefficient of the gain coupled laser does not vary with the thickness of the diffraction grating layer and the duty ratio, and same-characteristic DFB lasers can be fabricated with stability thereby allowing higher production yields for this type of laser.

However, as also seen in FIG. 14b, the gain coupled DFB laser has an absorption loss curve 1403' that crosses the lasing wavelength $\lambda$e and, therefore, absorption loss at the desired lasing wavelength $\lambda$e is large resulting in a high threshold current and unfavorable optical output-injection current characteristics. Moreover, although the absorption loss curve 1403' also crosses the undesired wavelength of $\lambda$max, the absorption coefficient $\alpha$max is approximately equal to the absorption coefficient $\alpha$e. That is, as with the refractive index coupled DFB laser, the absorption curve 1403' of the gain coupled DFB laser affects $\lambda$max and $\lambda$e equally and the peak wavelength $\lambda$max of the optical gain distribution of the active layer is not suppressed with respect to the lasing wavelength $\lambda$e resulting in a low side mode suppression ratio (SMSR). For example, in the conventional DFB lasers of FIGS. 14a and 14b, the SMSR, though depending on the amount of detuning to the lasing wavelength of the DFB laser, falls within a comparatively small range of 35 and 40 dB. Also like the refractive index coupled DFB laser, since the absorption curve 1403' affects $\lambda$max and $\lambda$e equally, wide detuning cannot be accomplished because the wider the spacing between the $\lambda$max and $\lambda$e wavelengths, the smaller the gain of the desired lasing wavelength $\lambda$e will be with respect to the undesired $\lambda$max. Thus, whether the $\lambda$e is set shorter or longer than $\lambda$max, the absolute value of the detuning amount $|\lambda e - \lambda max|$ of conventional refractive index and gain coupled DFB lasers is limited several tens of nanometers thereby causing unfavorable single mode and temperature range characteristics for these devices.

SUMMARY OF THE INVENTION

Accordingly, one object of the present invention is to provide a semiconductor laser device and method which overcomes the above described problems.

According to a first aspect of the invention, there is provided a semiconductor laser device having a semiconductor substrate, an active region formed on the semiconductor substrate and configured to radiate light having a predetermined wavelength range, a wavelength selecting structure configured to select a first portion of the radiated light for emitting from the semiconductor laser device, and an absorption region located in a vicinity of the active region and configured to selectively absorb a second portion of the radiated light, the first portion of the radiated light having a different wavelength than the second portion of the radiated light.

In one embodiment of the first aspect, the first portion of the radiated light is a single mode lasing wavelength $\lambda$e and the second portion of the radiated light is a peak wavelength $\lambda$max of an optical gain distribution of the active region. In this embodiment, the absorption region is configured to provide operational characteristics satisfying any one of the relationships: $0 < \lambda e - \lambda abs \leq 100$ nm; $0 < \lambda e - \lambda abs \leq 70$ nm; or $\lambda e - \lambda abs = 50$ nm, where $\lambda$abs is the bandgap wavelength of the absorption region, and $\lambda$e is the single mode lasing wavelength.

In another embodiment of the first aspect, the absorption region of the semiconductor laser is configured to provide operational characteristics satisfying any one of the relationships: $\alpha max > \alpha e$; $\alpha max - \alpha e \geq 1$ cm$^{-1}$; or $\alpha max - \alpha e \geq 5$ cm$^{-1}$, in terms of waveguide loss, where $\alpha$max is an absorption coefficient with respect to the peak wavelength $\lambda$max of the optical gain distribution of the active region, and $\alpha$e is an absorption coefficient with respect to the selected lasing wavelength $\lambda$e. In this embodiment, the absorption region may be configured such that the absorption coefficient $\alpha$e is substantially 0.

In yet another embodiment of the first aspect of the present invention, the active region, wavelength selecting structure, and absorption region are configured to provide operational characteristics satisfying any one of the relationships $\lambda abs<\lambda max<\lambda e$, or the relationship $\lambda max<\lambda abs<\lambda e$, where $\lambda abs$ is the bandgap wavelength of the absorption region, $\lambda max$ is the peak wavelength of an optical gain distribution of the active region, and $\lambda e$ is the single mode lasing wavelength.

In another embodiment of the first aspect, the active region and absorption region are configured to provide operational characteristics such that $\lambda abs-\lambda max$ ranges from approximately 10 nm to approximately 20 nm.

In another aspect of the present invention, the wavelength selecting structure of the semiconductor laser device includes an external fiber grating, a distributed Bragg reflector, or an integrated diffraction grating formed on the active region. This aspect of the invention may include each of the operational characteristics of the embodiments described in the first aspect above. In addition, where the wavelength selecting structure includes an internal diffraction grating, the structure includes a group of periodically spaced parallel rows of grating material that extends along a portion of the entire length, or the entire length of the active region on which the diffraction grating is formed. In this embodiment, the grating material includes GaInAsP, and the cladding material includes InP.

In a third aspect of the present invention, the absorption region includes a selective absorption semiconductor layer. This aspect of the invention may include each of the operational characteristics of the embodiments described in the first aspect above. In one embodiment of the third aspect, the selective absorption layer is a quantized layer with a thickness small enough to develop a quantum effect. The selective absorption layer may include InGaAs and have a thickness of approximately 5 nm.

The semiconductor laser device may also have a single mode lasing wavelength $\lambda e$ which is greater or less than the peak wavelength $\lambda max$ of the optical gain distribution of the active region and may include an absolute value of a detuning amount of at least 20 nm. The threshold current of the laser device may be no greater than 9 mA.

In another aspect of the present invention, first portion of the radiated light includes multiple oscillation wavelengths.

In yet another aspect of the invention, the absorption region of the semiconductor laser device includes both a diffracation grating and a selective absorption layer mode of a quantized structure. In this aspect, the the diffraction grating selectively absorbs wavelengths shorter than the lasing wavelength $\lambda e$, and the selective absorption layer selectively absorbs wavelengths longer than the lasing wavelength $\lambda e$.

The semiconductor laser device may be used in an optical fiber amplifier such as a raman amplifier, a wavelength division multiplexing system, or a semiconductor laser module.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
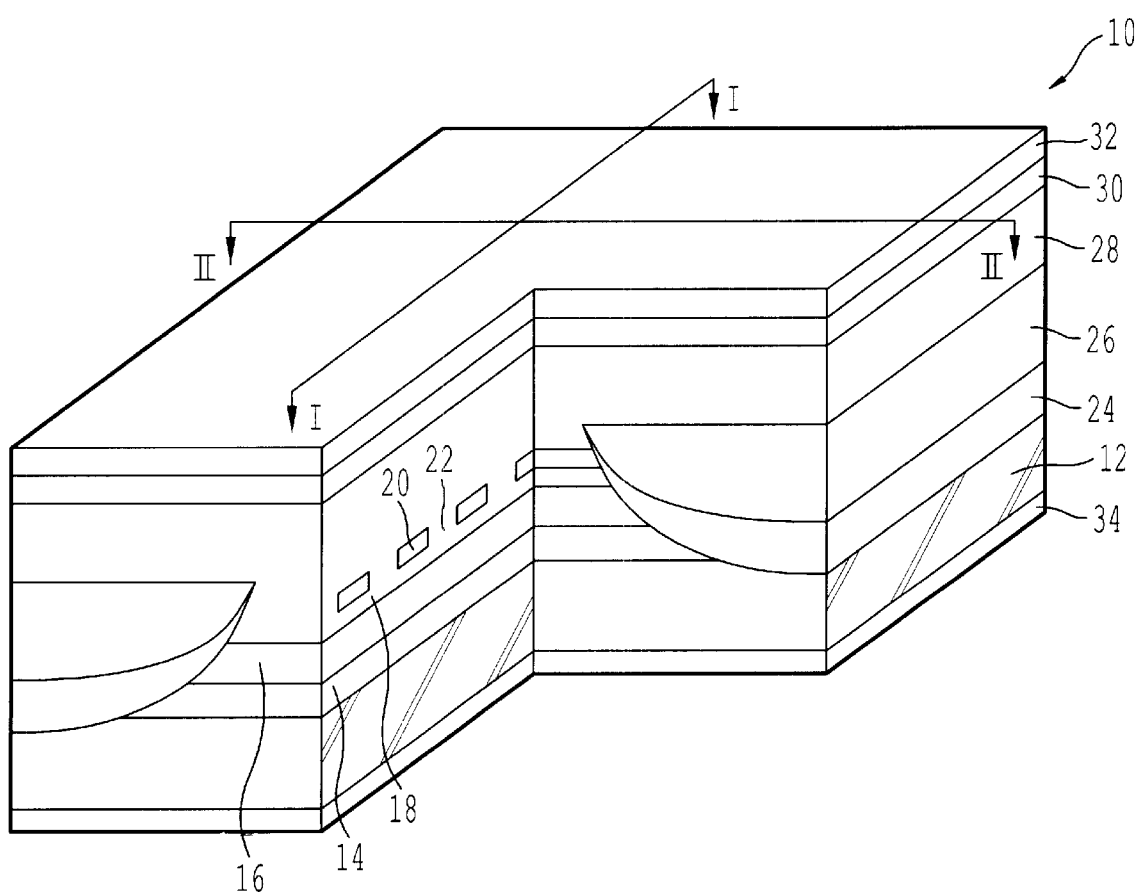
FIG. 1 is a partially sectional perspective view showing the structure of a semiconductor layer device according to a first embodiment of the present invention.
Figure 2:
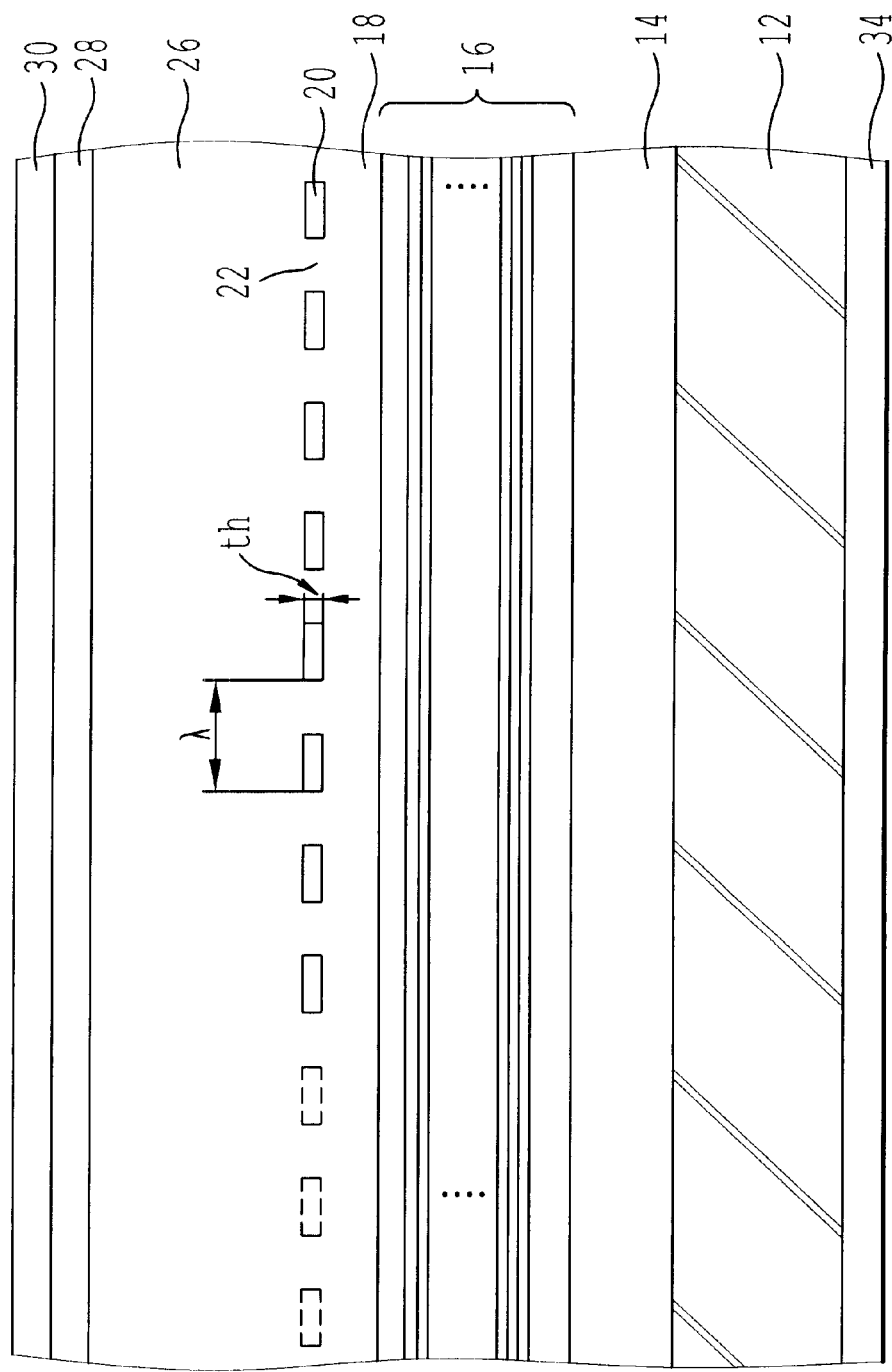
FIG. 2 is a sectional view of the semiconductor laser device taken along the arrowed line I—I of FIG. 1.

Referring now to the drawings wherein like elements are represented by the same or similar reference designations throughout, and more particularly to FIGS. 1 and 2, there is shown a semiconductor laser device 10 for providing selective light absorption in accordance with a first embodiment of the present invention. FIG. 1 is a partially sectional perspective view showing the structure of a semiconductor laser device according to the first embodiment of the present invention, and FIG. 2 is a sectional view of the semiconductor laser device taken along the arrowed line I—I of FIG. 1.

The semiconductor device of FIGS. 1 and 2 is a buried hetero-junction type DFB laser device including an n-InP substrate 12 having a 1-$\mu$m-thick n-InP buffer layer 14, an active layer or active region 16, and a 200-nm-thick p-InP spacer layer 18 sequentially stacked on the substrate 12. Buffer layer 14 serves both as a buffer layer by the n-InP material and a under cladding layer, while the active layer 16 is a separate confinement multiple quantum well (SCH- MQW) structure. As best seen in FIG. 2, a diffraction grating 20 of a GaInAsP material is periodically formed within the p-InP spacer layer 18 substantially along the entire length of active layer 16. However, the diffraction grating 20 may be formed over a portion of the entire length of active layer 16 as shown by the phantom grating material in FIG. 2. The diffraction grating 20 of the embodiment of FIGS. 1 and 2 has a film thickness "th" of 20 nm, a period "Λ" of 240 nm, and selects a laser beam having a lasing wavelength of 1550 nm to be emitted by the semiconductor laser device 10.

On top of the diffraction grating 20 is a p-InP first cladding layer 22 having the diffraction grating 20 buried therein. A top portion of the n-InP substrate, the n-InP buffer layer 14, the active layer 16, the p-InP spacer layer 18, the diffraction grating 20, and the p-InP first cladding layer 22 having the diffraction grating 20 buried therein form a laminated structure which is etched into mesa stripes so that the active layer 16 has a width of approximately 1.5 $\mu$m. Carrier block structures each including a p-InP layer 24 and an n-InP layer 26 are formed on both sides of the mesa stripes. The DFB laser device 10 also has a 2 $\mu$m-thick p-InP second cladding layer 28 and a heavily doped p-GaInAs contact layer 30 over the first InP cladding layer 22 and the n-InP layer 26. Also included is a p-side electrode 32 made of a Ti/Pt/Au laminated metal film over the contact layer 30, and an n-side electrode 34 made of AuGeNi on the bottom surface of the substrate 12.

It is to be understood that the device of FIGS. 1 and 2 is for exemplary purposes only as many variations of the structure of the laser device 10 will be readily apparent to one having ordinary skill in the art. For example, the material composition and layer thicknesses described may be changed without deviating from the principles of the present invention. Thus, the embodiment of FIGS. 1 and 2 are exemplary for a better understanding of the present invention and the present invention is not limited to these illustrations.

Figure 3A:
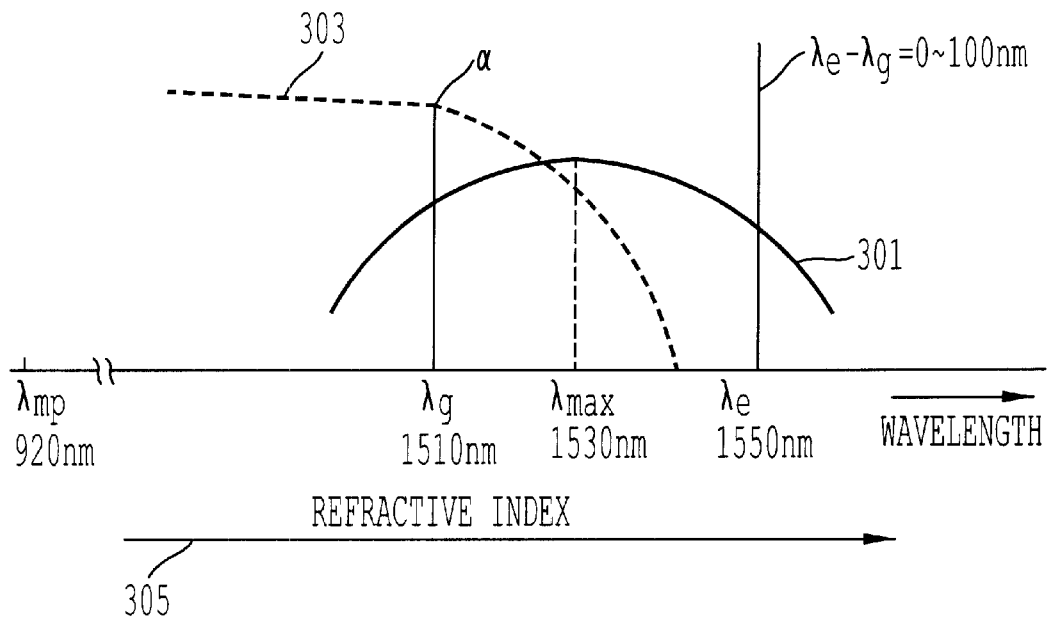
FIGS. 3a and 3b are a wavelength graphs showing the operational characteristics of DFB laser devices according to the first embodiment of the present invention.

In order to evaluate the DFB laser device 10, wafers having the laminated structure of FIGS. 1 and 2 were cleaved into chips, bonded to can-package type stems, subjected to coating the front facet to form a non-reflective film and at the rear facet to form a high-reflectance film, and measured for the laser characteristics thereof. FIG. 3a shows exemplary operational characteristics of a DFB laser according to the embodiment of FIGS. 1 and 2 of the present invention. As seen in FIG. 3a, the DFB laser 10 has a lasing wavelength $\lambda$e of approximately 1550 nm, and the diffraction grating 20 has a bandgap wavelength $\lambda$g of approximately 1510 nm. In a preferred embodiment, GaInAsP having a of approximately 1510 nm is used to form the diffraction grating 20. Thus, the difference in the lasing wavelength and the bandgap wavelength of the diffraction grating in FIGS. 1 and 2 is approximately 40 nm. More generally, a laser device in accordance with the present invention reflects a difference $\lambda$e–$\lambda$g of between 0 and 100 nm as noted in FIG. 3a ($\lambda$e–$\lambda$g=0~100 nm). Moreover, the peak wavelength $\lambda$ of the active layer 16 is approximately 1530 nm in the optical gain distribution curve 301. Therefore the DFB laser of FIG. 3a satisfies the relationship:

$$\lambda g < \lambda max < \lambda e.$$

As with the prior art figures discussed in the Background section above, FIG. 3a depicts an absorption curve 303 as well as an arrow 305 showing the refractive index of the grating material 20 and the active layer 16. The present inventors have discovered that the a DFB laser of FIGS. 1 and 2 having the operational characteristics of FIG. 3a provides several advantages over the prior art DFB lasers.

First, the semiconductor laser device of FIGS. 1 and 2 provides selective absorption of the undesirable peak gain wavelength $\lambda$max. As described above, the bandgap wavelength of a material is closely related to the wavelength absorption characteristics of the material. Thus, in the embodiment of FIGS. 1 and 2, the diffraction grating material 20 is selected to have a bandgap wavelength $\lambda$g that will provide an absorption curve 303 that crosses the peak wavelength $\lambda$max but does not cross the lasing wavelength $\lambda$e. That is, the absorption at wavelength $\lambda$e is preferably 0. More generally, however, according to the embodiment of FIGS. 1 and 2, the diffraction grating is constructed such that an absorption coefficient $\alpha$max is greater than an absorption coefficient $\alpha$e. For example, the diffraction grating 20 is preferably constructed such that $\alpha$max–$\alpha$e is greater than or equal to 1 cm$^{-1}$ in terms of waveguide loss, and more preferably greater than or equal to or equal to 5 cm$^{-1}$ in terms of waveguide loss.

In addition, by providing such selective absorption of the peak wavelength $\lambda$max, a laser device of FIGS. 1 and 2 simultaneously provides the benefits of both the refractive index coupled and the gain coupled DFB lasers described in the Background section above. That is, as with the refractive index coupled DFB laser described in FIG. 14a, the selective absorption loss curve 303 of the present invention does not cross the lasing wavelength $\lambda$e. Therefore, the absorption loss at $\lambda$e is very small and the DFB laser depicted in FIG. 3a has a low threshold, and favorable optical output-injection current characteristics and higher output power. Specifically, the lasing efficiency of the present invention was compared with that of the conventional type DFB laser devices, revealing that the absorption with respect to the lasing wavelength of the diffraction grating 20 was sufficiently lower, and that the threshold current was as low as 9 mA in the present embodiment.

Figure 14A:
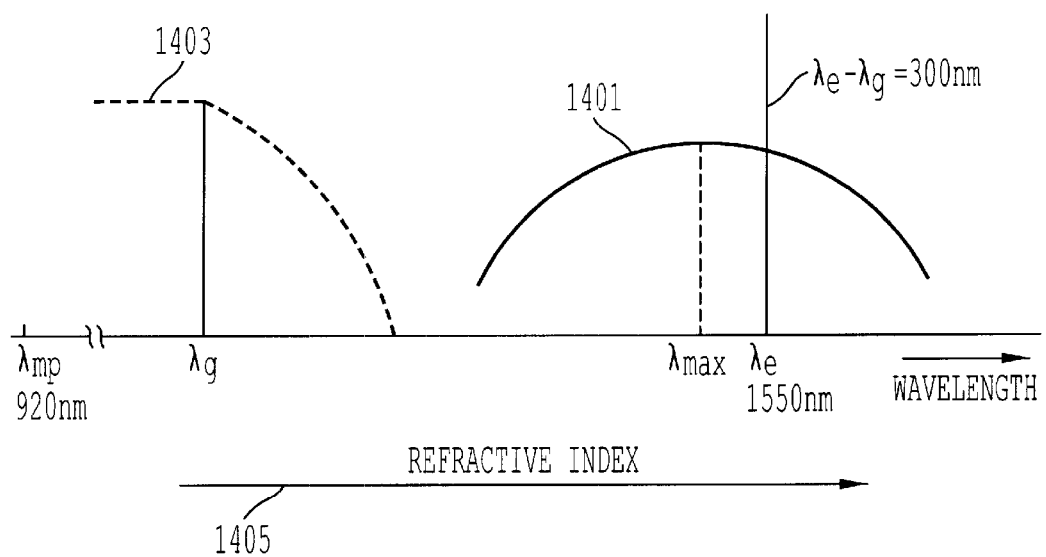
FIGS. 14a and 14b are wavelength graphs showing the operational characteristics of conventional refractive index coupled and gain coupled DFB lasers.
Figure 14B:
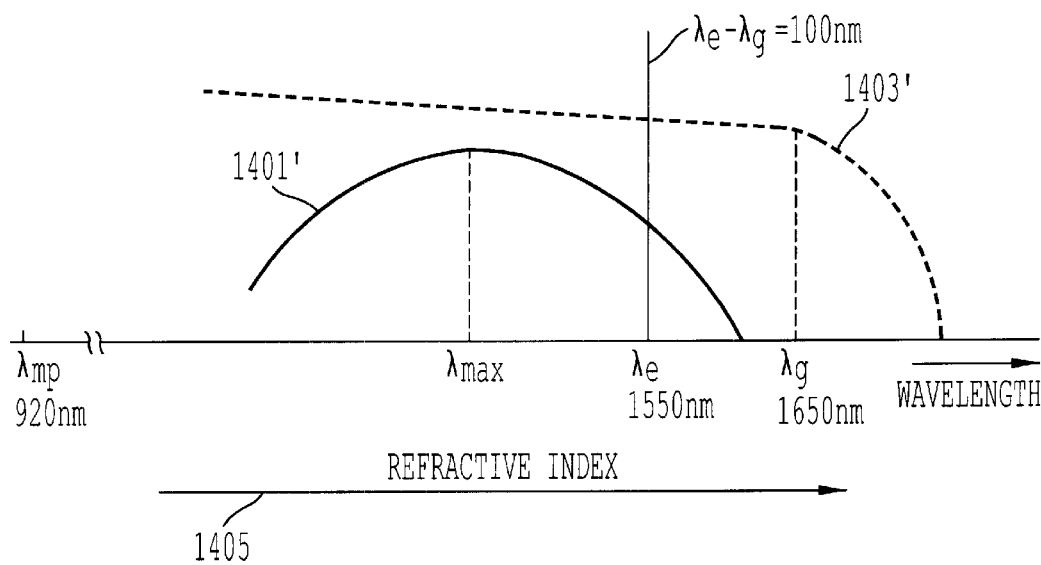

Moreover, as with the gain coupled DFB laser described in FIG. 14b, the laser having the characteristics of FIG. 3a has a relatively large difference between the refractive index of the grating material 20 and refractive index of the InP buried layer 22. As mentioned, this makes it possible to vary the duty ratio and increase the distance between the grating material 20 and the active layer without varying the coupling coefficient of the laser device of the present invention. Therefore, even if the p-InP spacer layer 18 is increased in thickness to separate the diffraction grating 20 away from the active layer 16, it is possible to obtain a diffraction grating coupling coefficient of adequate magnitude. Accordingly, the tolerance in the crystal growing process of the fabrication process is alleviated to allow higher production yields of a laser device in accordance with the present invention.

The DFB laser device of FIGS. 1 and 2 provides advantages not offered by either of the conventional laser devices described above. First, since the DFB laser 10 according to the present invention selectively absorbs the peak wavelength $\lambda$max, the side mode suppression ratio (SMSR) is significantly better than that of the prior art devices. Specifically, the DFB laser device 10 was found to have stable single mode lasing characteristics and offered a side mode suppression ratio as large as 45–50 dB. As mentioned above, conventional DFB laser devices offered a SMSR generally limited to around 35–40 dB. Moreover, because the selective absorption of the invention of FIGS. 1 and 2 provides an absorption of $\lambda$max that is greater than the absorption of $\lambda$e, wide detuning can be accomplished using the semiconductor laser of FIG. 3a. That is, the absolute value of the detuning amount |λe−λmax| can be made greater since the selective absorption and high SMSR can be used to maintain single-mode properties of the longitudinal mode and suppress the gain at the peak wavelength λmax. In this regard, it is noted that, by way of the present invention, the present inventors have discovered a device which can achieve wide detuning and can also be manufactured with high production yields due to the spacing between the active and grating layers as described above. Finally, since wide detuning can be achieved, the semiconductor laser device according to the present invention can provide high output power over a wide temperature range. Thus, the semiconductor laser of the first embodiment can maintain favorable single mode properties even though detuning is increased.

Figure 3B:
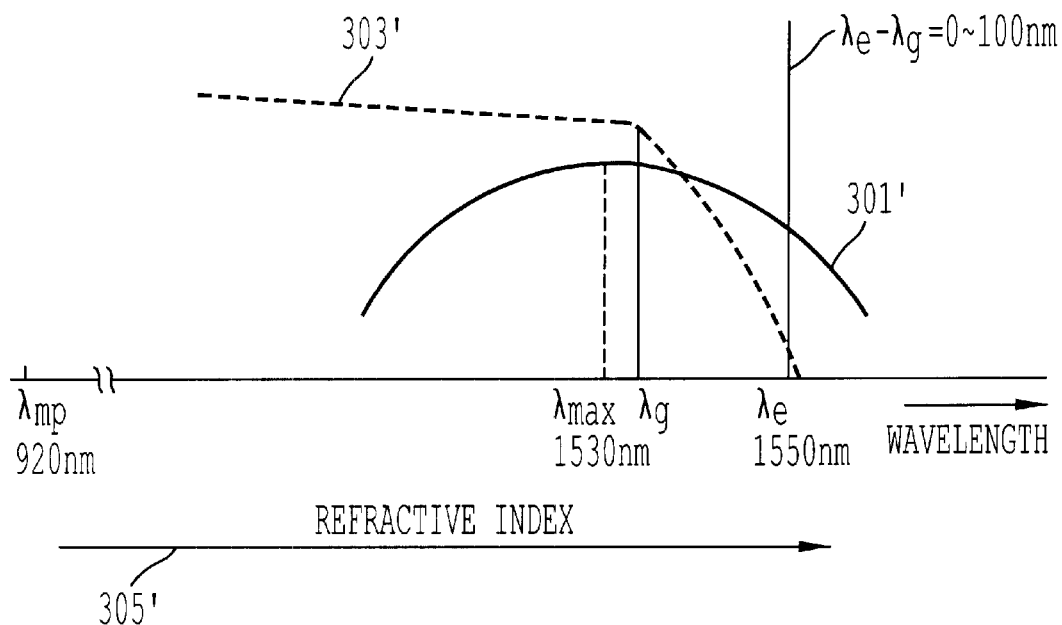

While the above description provides an example of a DFB laser device having a $\lambda_g$ less than both $\lambda_e$ and λmax, an absorption coefficient αmax greater than the absorption coefficient αe can also be achieved by setting the bandgap wavelength $\lambda_g$ of the diffraction grating 20 to a value between the peak wavelength of the optical gain distribution and the lasing wavelength 1550 nm of the DFB laser 10 as shown in FIG. 3b. While these characteristics realizes the benefits of the present invention, the absorption caused by the tails of the band edges also occurs on the lasing wavelength $\lambda_e$ as seen in FIG. 3b. Thus, the threshold current increases and the lasing efficiency decreases, which is generally undesirable. It is to be noted, however, that the concept of selective absorption is not limited to selectively absorbing λmax. For purposes of the present invention, selective absorption extends to absorbing any portion of the light radiated by the active layer and not selected by the wavelength selecting structure as the emitted lasing wavelength. The selectively absorbed portion may vary depending on the application of the laser device.

Figure 4A:
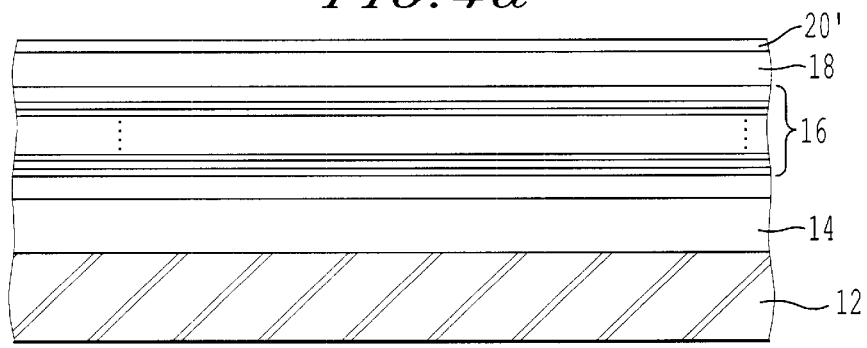
FIGS. 4(a)–4(e) are sectional views depicting the steps of fabricating the semiconductor laser device according to the first embodiment of the present invention.
Figure 4B:
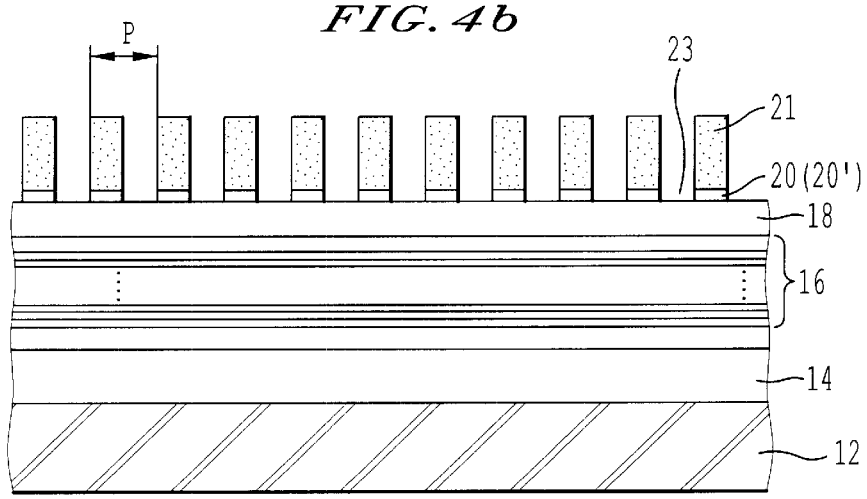
Figure 4C:
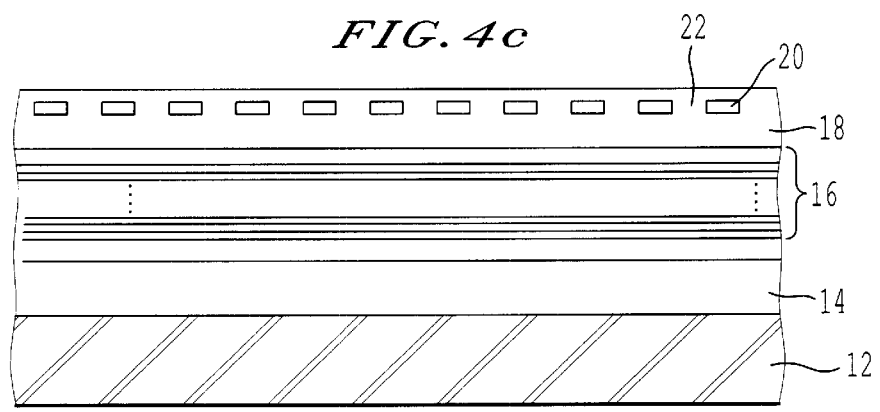
Figure 4D:
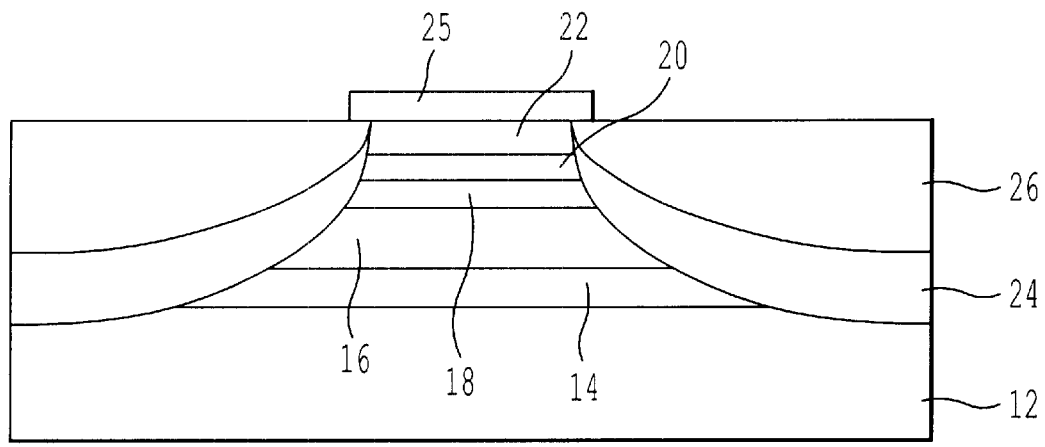
Figure 4E:
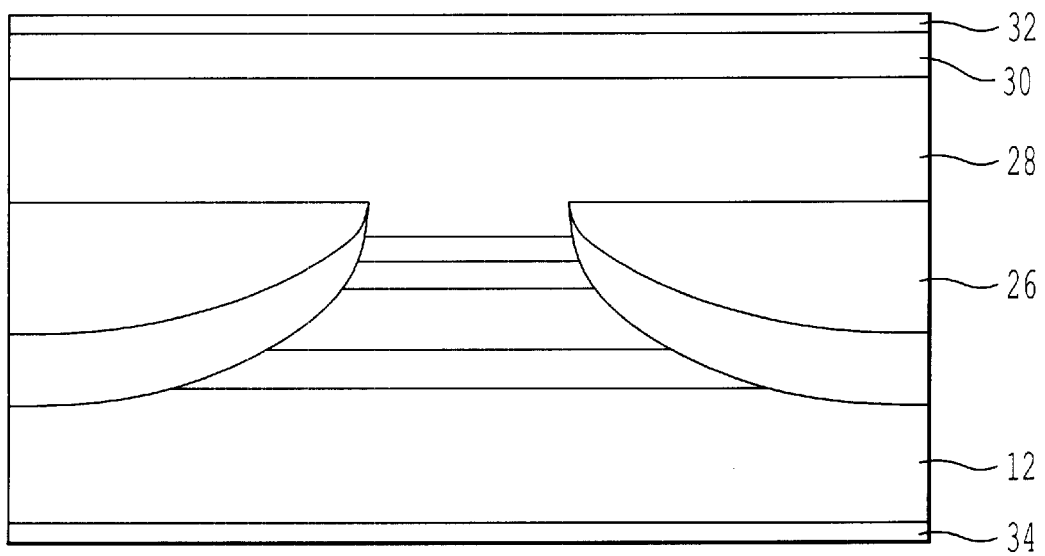

FIGS. 4a–4e are sectional views showing the method steps of fabricating the DFB laser device 10 of FIGS. 1 and 2 of the present invention. FIGS. 4a–4c show cross sections taken along the arrowed line I—I of FIG. 1, while FIGS. 4d and 4e show cross sections taken along the arrowed line II—II of FIG. 1.

As seen in FIG. 4a, the process begins with an n-InP substrate 12 on which a 1-μm-thick n-InP buffer layer 14, MQW-SCH active layers 16, a 200-nm-thick p-InP spacer layer 18, and a 20-nm-thick GaInAsP diffraction grating layer 20' are sequentially stacked. Each layer is epitaxially grown on an n-InP substrate 12 in succession, in a metal-organic chemical vapor deposition (MOCVD) system at a growth temperature of 600° C. to form the laminated structure shown in FIG. 4a. An electron beam (EB) resist is applied on the diffraction grating layer 20' with a thickness of approximately 100 nm and the resist layer is patterned according to conventional techniques to form a diffraction grating pattern 21 having a period Λ of approximately 240 nm. Thereafter, etching is performed in a dry etching system with the diffraction grating pattern 21 as the mask, whereby trenches 23 penetrating the diffraction grating layer 20' are formed to expose the p-InP spacer layer 18 at the trench bottoms. This forms a diffraction grating 20 as shown in FIG. 4b.

The diffraction grating pattern 21 is then removed, and, as shown in FIG. 4c, a p-InP first cladding layer 22 to bury the diffraction grating 20 is re-grown in the MOCVD system. Thereafter, a $SiN_x$ film is formed over the p-InP first cladding layer 22 in a plasma CVD system. Then, using a photolithography and reactive ion etching system (RIE), the $SiN_x$ film is processed into a stripe to form a $SiN_x$ film mask 25 as seen in FIG. 4d. Subsequently, using the $SiN_x$ film mask 25 as the etching mask, the p-InP first cladding layer 22 including the diffraction grating 20, the p-InP spacer layer 18, the active layer 16, the n-InP buffer layer 14, and a top portion of the n-InP substrate 12 are etched into mesa stripes with an active layer width of the order of 1.5 μm. Then, using the $SiN_x$ film mask 25 as the selective growth mask, a p-InP layer 24 and an n-InP layer 26 are selectively grown in succession. This forms carrier block structures on both sides of the mesa stripes as shown in FIG. 4d.

Next, the $SiN_x$ film mask 25 is removed before a 2-μm-thick p-InP second cladding layer 28 and a contact layer 30, or a GaInAs layer that is heavily doped to make an ohmic contact with a p-side electrode 32, are epitaxially grown as shown in FIG. 4E. The n-InP substrate 12 is polished at its bottom surface to a substrate thickness of on the order of 120 μm. Then, a Ti/Pt/Au laminated metal film is formed as the p-side electrode 32 over the contact layer 30. On the bottom surface of the substrate is formed an AuGeNi film as an n-side electrode 34.

The wafer having the above-described laminated structure can be cleaved into a chip and bonded to a can-package type stem to form the DFB laser device shown in FIGS. 1 and 2. As mentioned above, by using a material for diffraction grating 20 that has a bandgap wavelength close to that of the active layer material 16, the difference in refractive index of the diffraction grating 20 and the surrounding InP layer 22 is increased. This allows a desired refractive index coupling coefficient to be obtained even if the diffraction grating 20 is separated farther from the active layer 16 than in the conventional DFB laser devices. Accordingly, the tolerance in the crystal growing process and in the fabrication process of FIGS. 4a–4d is eased to allow stable crystal growth.

Figure 5:
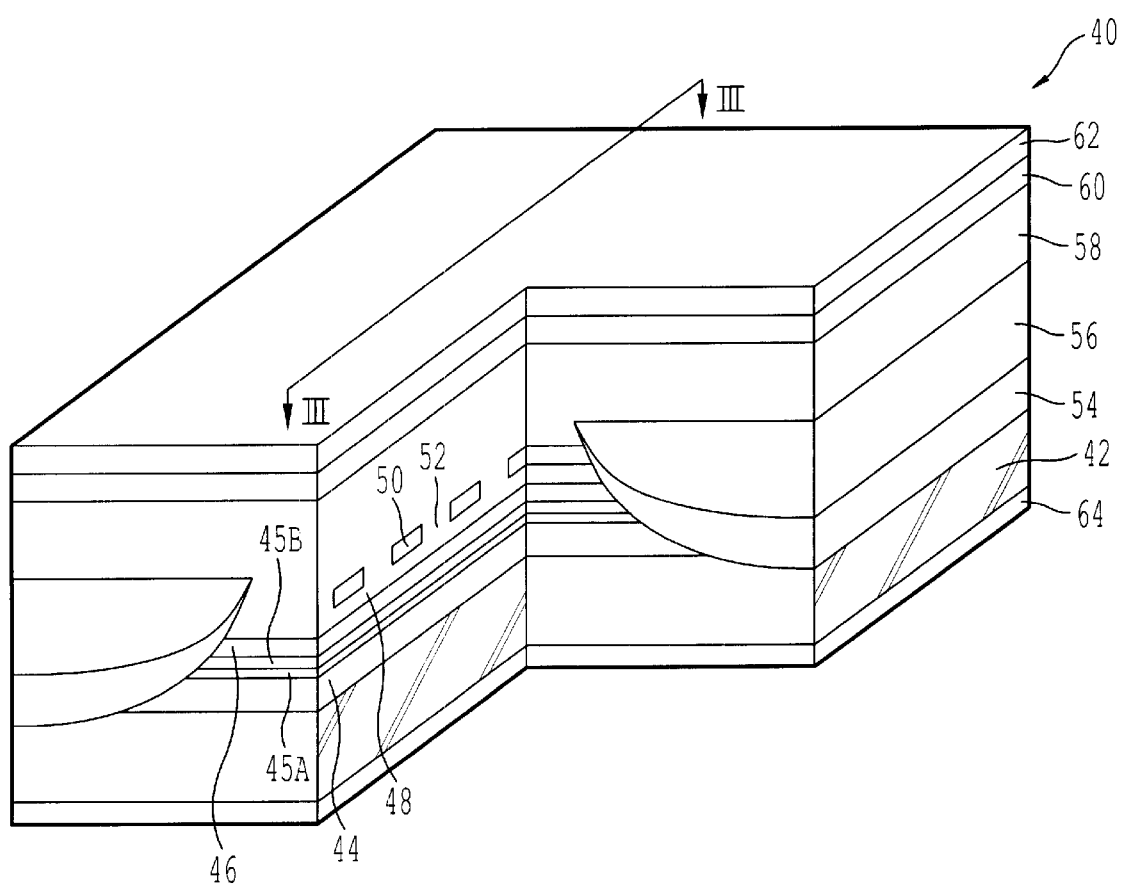
FIG. 5 is a partially sectional perspective view showing the structure of a semiconductor laser device according to a second embodiment of the present invention.
Figure 6:
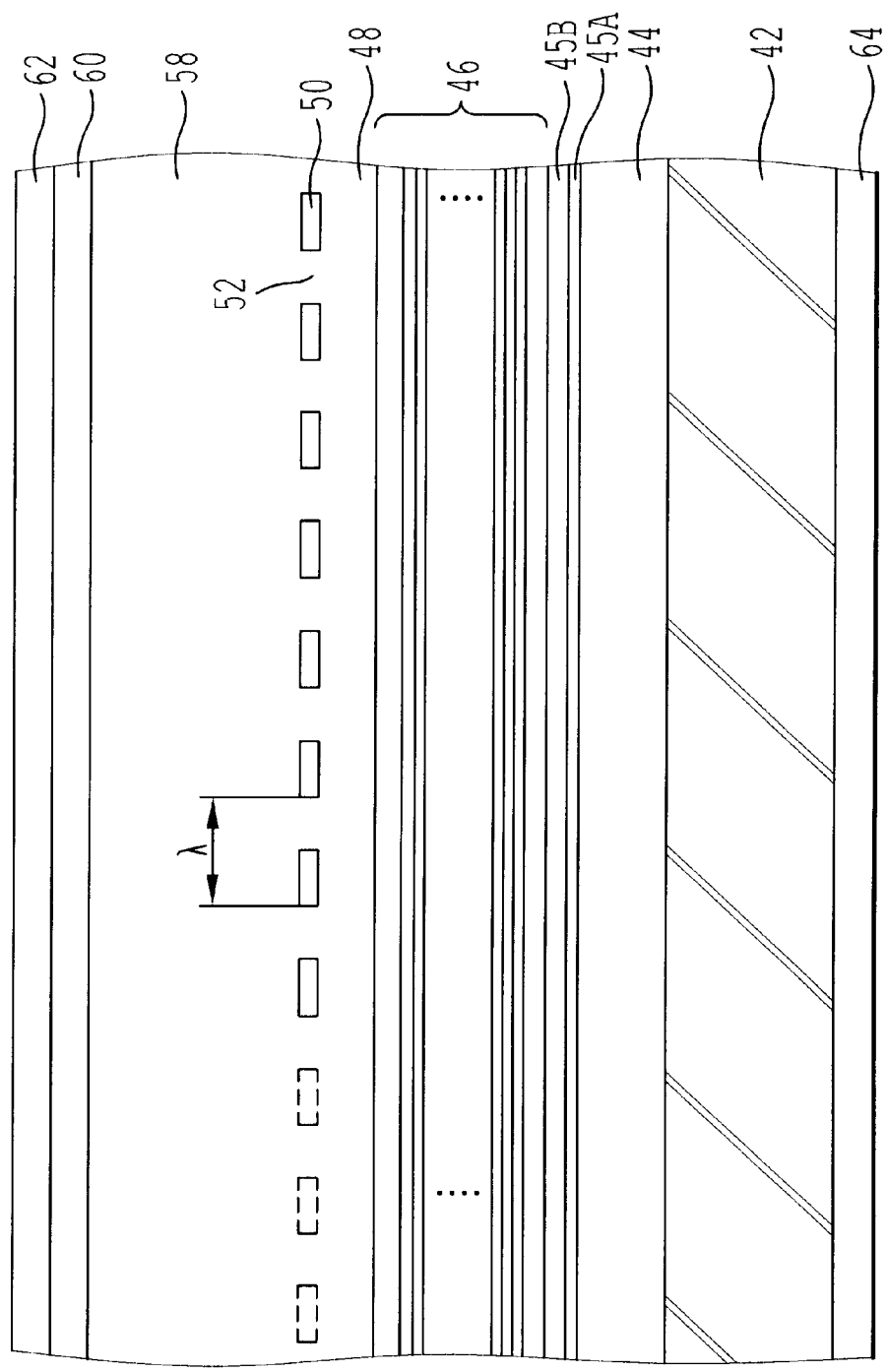
FIG. 6 is a sectional view of the semiconductor laser device taken along the arrowed line III—III of FIG. 5.

FIGS. 5 and 6 show a semiconductor laser device 40 for providing selective light absorption in accordance with a second embodiment of the present invention. FIG. 5 is a partially sectional perspective view showing the structure of a semiconductor laser device according to the second embodiment of the present invention, and FIG. 6 is a sectional view of the semiconductor laser device taken along the arrowed line III—III of FIG. 5. In the DFB laser device 10 of the embodiment 1, the absorption region of the laser device is provided in the diffraction grating 20. On the other hand, the semiconductor laser device 40 of the second embodiment, though constituted likewise as a buried heterojunction type DFB laser device with the designed lasing wavelength of 1550 nm, includes a selective absorption layer 45A, aside from the diffraction grating for selectively absorbing the light in the mode of the peak wavelength of the optical gain distribution of the active layer.

Specifically, the DFB laser device 40 includes a 1-μm-thick n-InP buffer layer 44, a 5-nm-thick InGaAs selective absorption layer 45A, a 100-nm-thick n-InP spacer layer 45B, MQW-SCH active layers 46, a 100-nm-thick p-InP spacer layer 48, a diffraction grating 50 including a 30-nm-thick GaInAsP layer having a period Λ of 240 nm, and a p-InP first cladding layer 52 having the diffraction grating 50 buried therein. The elements of the diffraction grating 50 may extend along the entire length of the active layer 46, or may extend along a portion of the length of the active layer 46 as shown by the phantom elements in FIG. 6. As with the embodiment of FIG. 1, these layers are epitaxially grown on an n-InP substrate 42 in succession by an MOCVD or similar method. The selective absorption layer 45A is a "quantized" structure which, for purposes of this invention, means the thickness of the selective absorption layer 45A is reduced to a size on the order of quantum mechanical wavelengths of electrons to develop the quantum effect. The thickness of selective absorption layer 45A is controlled so that the absorption edge wavelength (equivalent to bandgap wavelength) falls at a desired wavelength as will be further described below.

A top portion of the n-InP substrate 42, and the constituents of the laminated structure, i.e., the n-InP buffer layer 44, the selective absorption layer 45A, the n-InP spacer layer 45B, the active layer 46, the p-InP spacer layer 48, the diffraction grating 50, and the p-InP first cladding layer 52 having the diffraction grating 50 buried therein, are etched into mesa stripes so that the active layer 46 has a width of approximately 1.5 µm. Then, carrier block structures each including a p-InP layer 54 and an n-InP layer 56 are formed on both sides of the mesa stripes. Furthermore, the semiconductor laser device 40 has a 2-µm-thick p-InP second cladding layer 58 and a heavily doped p-GaInAs contact layer 60 over the first InP cladding layer 52 and the n-InP layer 56. The laser device of the second embodiment also includes a p-side electrode 62 including a Ti/Pt/Au laminated metal film over the contact layer 60, and an n-side electrode 64 made of AuGeNi on the bottom surface of the substrate 42.

As with the embodiment of FIGS. 1 and 2 of the present invention, it will be understood by one of ordinary skill in the art that the second embodiment of the present invention shown in FIGS. 5 and 6 is exemplary only and the compositions, film thicknesses, and the like of the compound semiconductor layers may be changed without deviating from the principles of the present invention. For example, while embodiment of FIGS. 5 and 6 shows the selective absorption layer 45A opposed to the diffraction grating across the active layer, it may be arranged on the same side as the diffraction grating. Although, it is noted that the opposite side arrangement has a higher degree of flexibility in design since the distance from the active layer can be arbitrarily selected. In addition, while the selective absorption layer 45A is shown as a single layer in FIGS. 5 and 6, multiple-quantum-well layers may be formed to achieve a greater difference in absorption coefficient as will be described below.

Figure 7A:
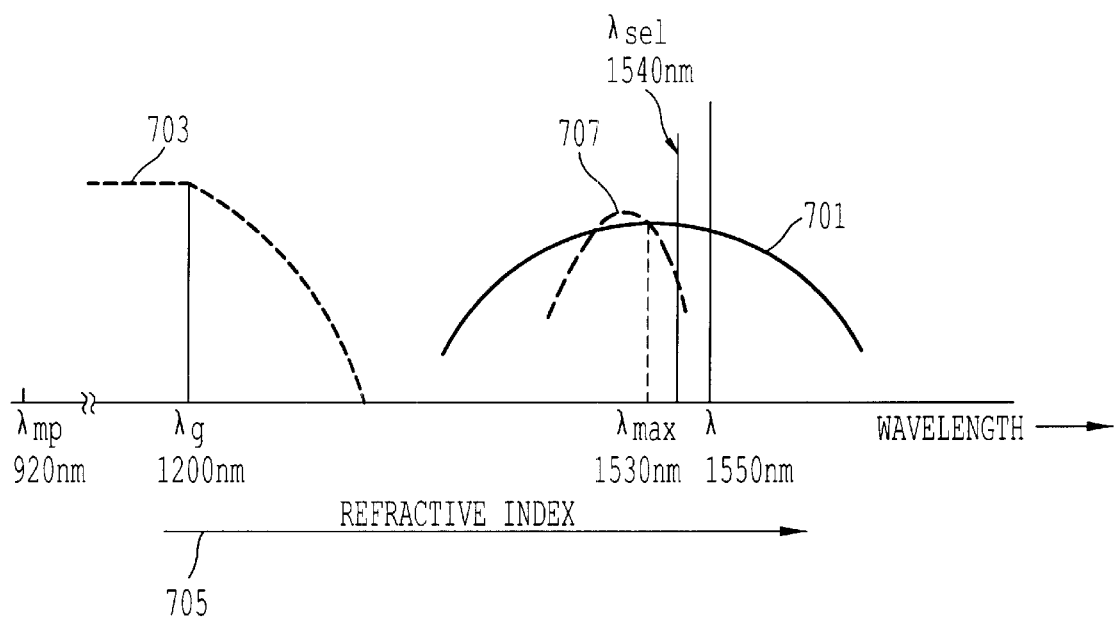
FIGS. 7(a) and 7(b) are wavelength graphs showing the operational characteristics of DFB laser devices according to the second embodiment of the present invention.

In order to evaluate the DFB laser device 40, wafers having the laminated structure of FIGS. 5 and 6 were cleaved into chips, bonded to can-package type stems, subjected to coating the front facet to form a non-reflective film and at the rear facet to form a high-reflectance film, and measured for the laser characteristics thereof. FIG. 7a shows exemplary operational characteristics of a DFB laser according to the embodiment of FIGS. 5 and 6 of the present invention. As seen in FIG. 7a, the DFB laser 40 has a lasing wavelength $\lambda e$ of approximately 1550 nm, the diffraction grating 50 has a bandgap wavelength $\lambda g$ of approximately 1200, and the peak wavelength $\lambda max$ of the active layer 46 is approximately 1530 nm in the optical gain distribution curve 701. Thus, the diffraction grating 50 is sufficiently transparent to the peak wavelength of the optical gain distribution of the active layer 46, and to the designed lasing wavelength of the DFB laser device 40. In addition, a bandgap wavelength $\lambda sel$ of the selective absorption layer 45A is approximately 1530 nm. Therefore the DFB laser of FIG. 7a satisfies the relationship:

$$\lambda max < \lambda sel < \lambda e.$$

FIG. 7a also depicts an absorption curve 707 of the selective absorption layer, as well as the absorption curve 703 and increasing refractive index shown by arrow 705. As with the embodiment of FIG. 1, the second embodiment of the present invention shown in FIGS. 5 and 6 presents many advantages over prior art laser devices.

First, the semiconductor laser device of FIGS. 5 and 6 provides selective absorption of the undesirable peak gain wavelength $\lambda max$. As mentioned above, the thickness of the selective absorption layer 45A is small enough to develop the quantum effect. The thickness of the selective absorption layer is controlled so that the absorption edge wavelength (equivalent to bandgap wavelength) falls around 1540 nm. Thus, the selective absorption layer 45A functions as a quantum well layer. Accordingly, the absorption coefficient of the selective absorption layer 45A, while showing some absorption at the peak wavelength (1530 nm) of the optical gain distribution of the active layer 46, allows little absorption with respect to the designed lasing wavelength of 1550 nm as seen in FIG. 7a.

Moreover, owing to the provision of the selective absorption layer 45A having a steep absorption edge having quantum effects, it becomes possible to realize an absorption region that has a significant difference between the absorption coefficient with respect to the peak wavelength of the optical gain distribution of the active layer 46 and the absorption coefficient with respect to the lasing wavelength. Thus, in the semiconductor laser device 40 according to the present embodiment, the quantum well layer or quantum dot layer with a steep absorption edge is provided as the selective absorption layer 45A to allow a large absorption coefficient at the gain peak wavelength $\lambda max$ while holding the absorption of the lasing wavelength to a minimum. Similar to the first embodiment of the present invention, the selective absorption layer 45A is preferably constructed such that $\alpha max - \alpha e$ is greater than or equal to 1 cm$^{-1}$ (or more preferably 5 cm$^{-1}$) in terms of waveguide loss, and has a value $\alpha e$ substantially equal to 0. However, as with the first embodiment the quantized structure 45A may be constructed to provide selective absorption at any wavelength depending on the application of the laser device 40.

As with the refractive index coupled DFB laser described in FIG. 14a, the selective absorption loss curve 707 of the laser device 40 is beneficial in that it does not cross the lasing wavelength $\lambda e$. Therefore, the absorption loss at $\lambda e$ is very small and the DFB laser depicted in FIG. 7a has a low threshold current and favorable optical output-injection current characteristics. Specifically, the lasing efficiency of the present invention was compared with that of the conventional type DFB laser devices, revealing that the absorption with respect to the lasing wavelength of the diffraction grating 50 was sufficiently lower, and that the threshold current was as low as 8 mA in the present embodiment.

Moreover, since the DFB laser 40 according to the invention of FIGS. 7a selectively absorbs the peak wavelength $\lambda max$, the side mode suppression ratio (SMSR) is significantly better than that of the prior art devices. Specifically, the DFB laser device 40 was found to have stable single mode lasing at 1550 nm and offered a side mode suppression ratio of 50 dB. Thus, the absorption by the selective absorption layer 45A at the lasing wavelength is considered almost negligible.

In addition, because the selective absorption of the invention of FIGS. 5 and 6 provides an absorption of $\lambda max$ that is greater than the absorption of $\lambda e$, wide detuning can be accomplished using the semiconductor laser of FIG. 7a. That is, the absolute value of the detuning amount $|\lambda e - \lambda max|$ can be made greater since the selective absorption and high SMSR can be used to maintain single-mode properties of the longitudinal mode and suppress the gain at the peak wavelength $\lambda max$. Specifically, the period of the diffraction grating 50 of a DFB laser device having the same structure as that of the DFB laser device 40 was extended to set the lasing wavelength at 1570 nm. This modified second embodiment was observed and found to maintain a stable lasing in a single mode at the lasing wavelength of 1570 nm. Thus, even under considerable detuning toward longer wavelengths from the peak wavelength (1530 nm) of the optical gain distribution of the active layer, the selective absorption layer 45A can suppress lasings in the modes near the gain peak, to keep the stable single-mode lasing over a wide temperature range. Moreover, the ratio between the peak and valley of the Fabry-Perot mode near the peak wavelength of the optical gain distribution of the active layer 46 was smaller than in the conventional DFB lasers. The mode in this vicinity underwent a loss from the selective absorption layer 45A, so that the Fabry-Perot mode lasing was suppressed.

Figure 7B:
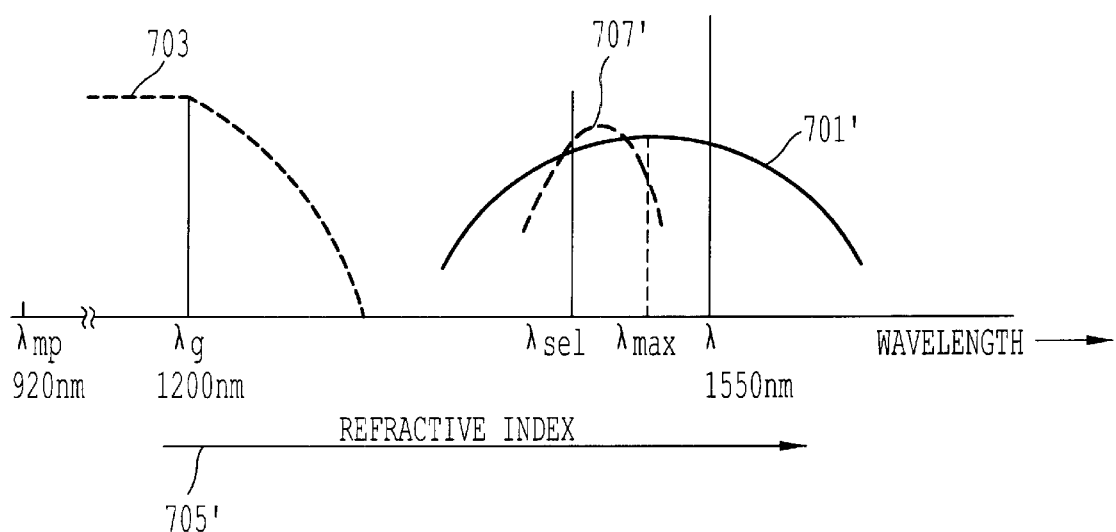

While the above description provides an example of a DFB laser device having a bandgap wavelength $\lambda$sel of the selective absorption layer 45A between the peak wavelength of the optical gain distribution and the lasing wavelength 1550 nm, an absorption coefficient $\alpha$max greater than the absorption coefficient $\alpha$e can also be achieved by setting $\lambda$sel less than both $\lambda_e$ and $\lambda$max in the DFB laser 40 as shown in FIG. 7b. As seen in this figure, the selective absorption curve 707' crosses the peak wavelength $\lambda$max but does not absorb the lasing wavelength $\lambda$e and therefore provides the benefits of the device depicted in FIG. 7a.

Figure 8A:
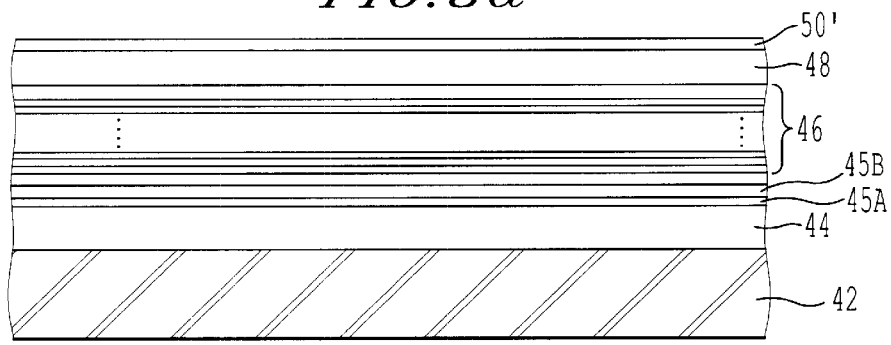
FIGS. 8(a)–8(c) are sectional views depicting the steps of fabricating the semiconductor laser device according to the second embodiment of the present invention.
Figure 8B:
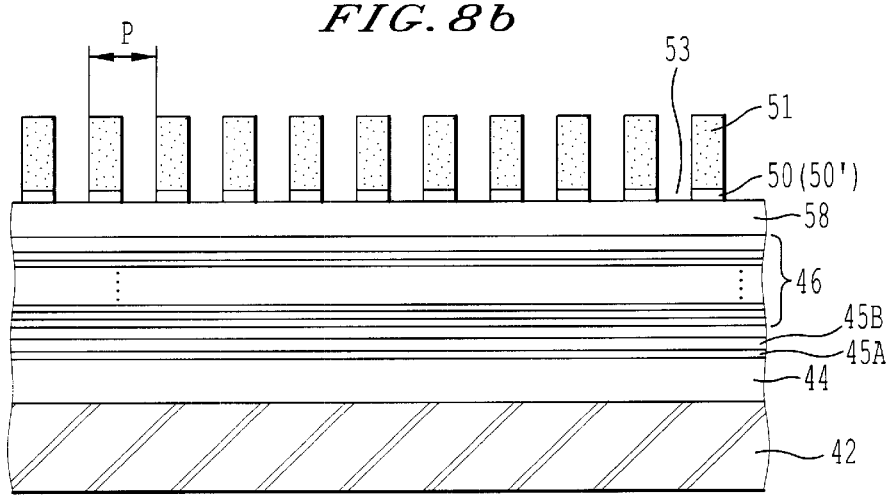
Figure 8C:
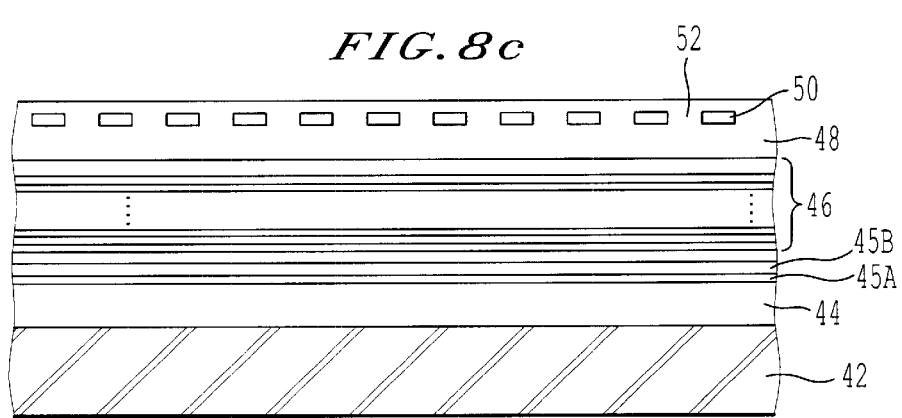

FIGS. 8a–8c are sectional views showing the method steps of fabricating the DFB laser device 40 according to the embodiment of FIGS. 5 and 6 of the present invention. FIGS. 8a–8c show cross sections taken along the arrowed line III—III of FIG. 5. As seen in FIG. 8a, the process begins with an n-InP substrate 42 on which an n-InP buffer layer 44, a selective absorption layer 45A including an InGaAs layer, an n-InP spacer layer 45B, MQW-SCH active layers 46, a p-InP spacer layer 48, and a 20-nm-thick GaInAsP diffraction grating layer 50' are sequentially stacked. Each layer is epitaxially grown on an n-InP substrate 42 in succession, in a metal-organic chemical vapor deposition (MOCVD) system at a growth temperature of 600° C. to form the laminated structure shown in FIG. 4a.

An electron beam (EB) resist is applied on the diffraction grating layer 50' with a thickness of approximately 100 nm and the resist layer is patterned according to conventional techniques to form a diffraction grating pattern 51 having a period $\Lambda$ of approximately 240 nm. Thereafter, etching is performed in a dry etching system with the diffraction grating pattern 51 as the mask, whereby trenches 53 penetrating the diffraction grating layer 50' are formed to expose the p-InP spacer layer 48 at the trench bottoms. This forms a diffraction grating 50 as shown in FIG. 8b.

The diffraction grating pattern 51 is then removed, and, as shown in FIG. 8c, a p-InP first cladding layer 52 to bury the diffraction grating 50 is re-grown in the MOCVD system. Thereafter, in the same manner as described with respect to FIGS. 4a–4d, the p-InP first cladding layer 42 including the diffraction grating 50, the p-InP spacer layer 48, the active layer 46, the n-InP spacer layer 45B, the selective absorption layer 45A, the n-InP buffer layer 44, and a top portion of the n-InP substrate 42 are etched into mesa stripes with an active layer width on the order of 1.5 $\mu$m using an SiN$_x$ film mask. Thereafter the SiN$_x$ film mask is used as a selective growth mask, a p-InP layer 54 and an n-InP layer 56 are selectively grown in succession. This forms carrier block structures on both sides of the mesa stripes.

Next, the SiN$_x$ film mask is removed before a 2-$\mu$m-thick p-InP second cladding layer 58 and a contact layer 60, are epitaxially grown. The n-InP substrate 42 is polished at its bottom surface to a substrate thickness of on the order of 120 $\mu$m. Then, a Ti/Pt/Au laminated metal film is formed as the p-side electrode 62 over the contact layer 60. On the bottom surface of the substrate is formed an AuGeNi film as an n-side electrode 64. The wafer having the above-described laminated structure can be cleaved into a chip and bonded to a can-package type stem to form the DFB laser device 40 whose laminated structure is shown in FIGS. 5 and 6.

Figure 9:
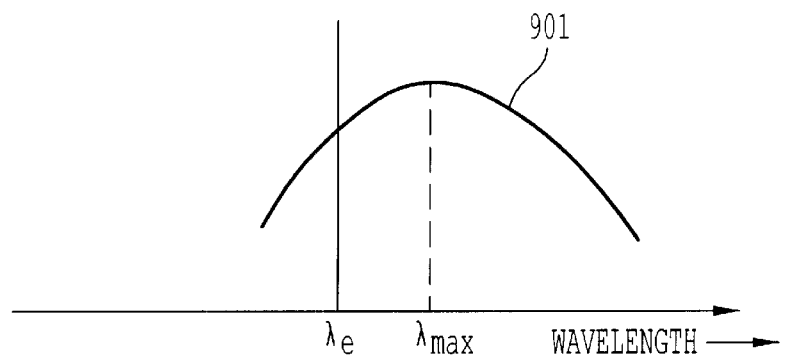
FIG. 9 is a wavelength graph showing alternative operational characteristics for the first and second embodiments of the present invention.

The first and second embodiments of the present invention have been described above in the context of a laser device having a lasing wavelength longer than a peak wavelength of the optical gain distribution. As described in the Background section above, this provides improved operational characteristics such as high power light intensity output and current injection characteristics at higher temperatures. However, the benefits of present invention may be realized by providing a laser device of the first or second embodiment wherein the lasing wavelength $\lambda$e is shorter than $\lambda$max as shown in FIG. 9. As seen in this figure, the peak wavelength $\lambda$max may be set to a wavelength value longer than the lasing wavelength $\lambda$e. This allows increased differential gain at high frequencies and provides favorable high-speed modulation characteristics for a laser device constructed according to the first and second embodiments. Moreover, as is understood by one of ordinary skill in the art, the difference in the wavelength values $\lambda$e and $\lambda$max (i.e., detuning value) may be set to any value, limited only by the selectivity of the absorption region, to realize the benefits of the present invention. Specifically, where a steep absorption curve is achievable, the lasing wavelength $\lambda$e may be set very close to the $\lambda$max in order to obtain a low threshold current characteristic for the laser of the first or second embodiments.

Figure 10:
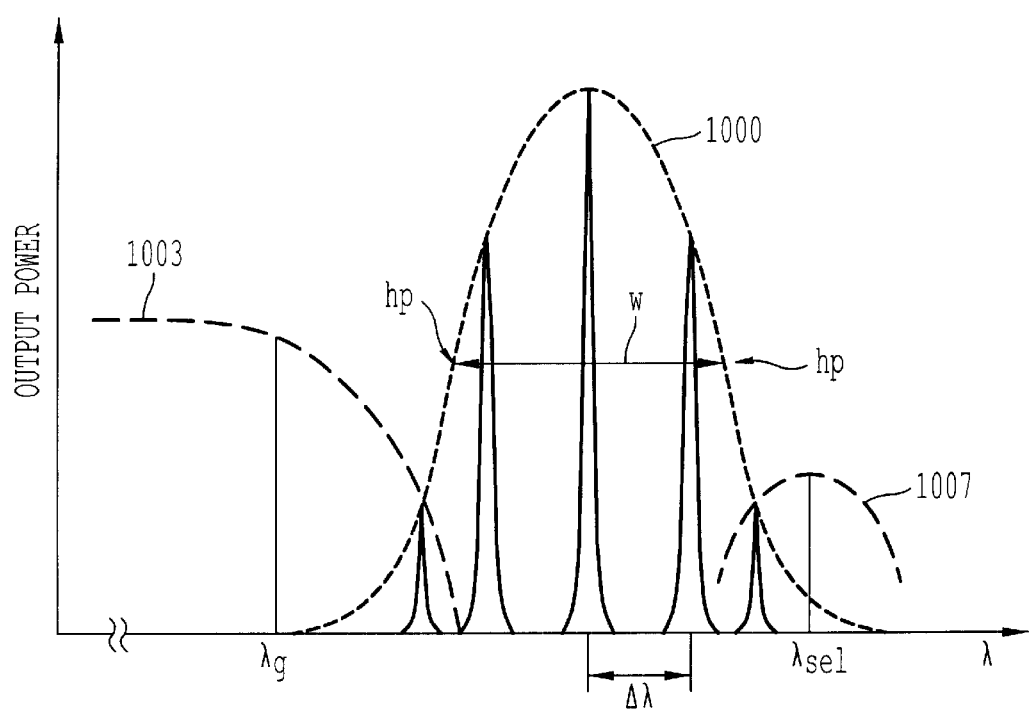
FIG. 10 is a graph showing an oscillation wavelength spectrum of a multiple mode semiconductor laser for which the present invention may be applied.

In addition, while the first and second embodiments of the present invention have been described with respect to a single mode laser, the present invention may be applied to a multiple mode laser device. FIG. 10 shows the multiple oscillation longitudinal mode output characteristics of a semiconductor laser device for which the present invention may be applied. As seen in this figure, an oscillation wavelength spectrum 1000 provides multiple longitudinal modes, separated by a wavelength interval $\Delta\lambda$, within a predetermined spectral width w of the oscillation spectrum 1000 as defined by of half power points hp of the oscillation spectrum. The predetermined spectral width w is a predetermined spectral bandwidth which defines a portion of the wavelength oscillation spectrum that includes the laser operating modes. The operating characteristics and applications of a multiple mode laser device are described in U.S. patent application Ser. No. 09/832,885 filed on Apr. 12, 2001, the entire contents of which is incorporated herein by reference.

Where the present invention is applied to a multiple mode laser device, the selective absorption properties of the present invention may be used to select a predetermined number of oscillation modes to be utilized by the multiple mode laser device. For example, the material of a diffraction grating of a multiple mode laser device may be selected for a bandgap wavelength $\lambda$g that will produce an absorption curve 1003 that selectively absorbs one of the multiple oscillation modes at the short wavelength end of the oscillation spectrum 1000 as seen in FIG. 10. Alternatively, or in addition to this, a selective absorption layer may be constructed to provide an absorption curve 1007 which suppresses an oscillation mode at the long wavelength end of the oscillation spectrum 1000. Thus, the selective absorption properties of the first and second embodiments of present invention may be used in combination to suppress the wavelength modes at each end of the oscillation spectrum to leave the desired number of modes remaining. Moreover, it is noted that the combination of embodiments 1 and 2 may be used to suppress long and short wavelength oscillations in a single mode laser device. In this regard, using the diffraction grating as the absorption region is generally preferred for selectively absorbing relatively short wavelengths, while the quantized structure of the second embodiment is preferred for selectively absorbing relatively longer wavelengths.

Furthermore, as mentioned above, the semiconductor laser device according to the present invention is applicable not only to DFB laser devices but also to DBR laser devices, FBG laser devices, and other semiconductor laser devices that include a wavelength selecting structure in the vicinity of the active layer, the wavelength selecting structure being capable of selecting a lasing wavelength $\lambda_e$ independent of the optical gain distribution of the active layer, and emitting laser light of the selected lasing wavelength $\lambda_e$. In this regard, the term "in the vicinity of the active layer" means existing within the range capable of detecting the light produced by the active layer.

Figure 11A:
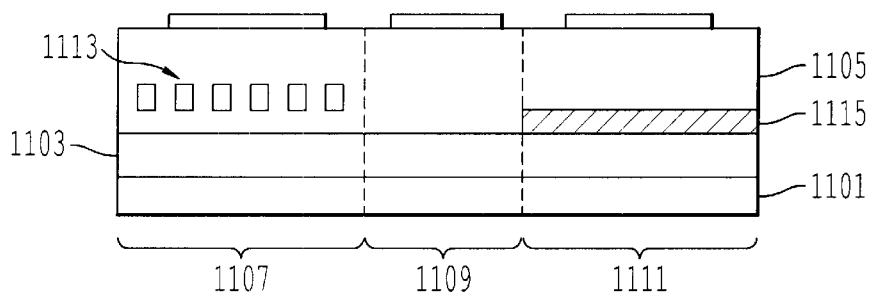
FIG. 11a–11c is an illustration of a distributed Bragg reflector (DBR) laser for which the present invention may be applied.
Figure 11B:
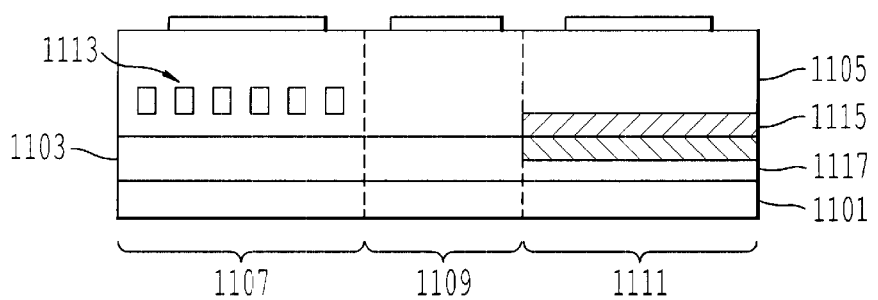
Figure 11C:
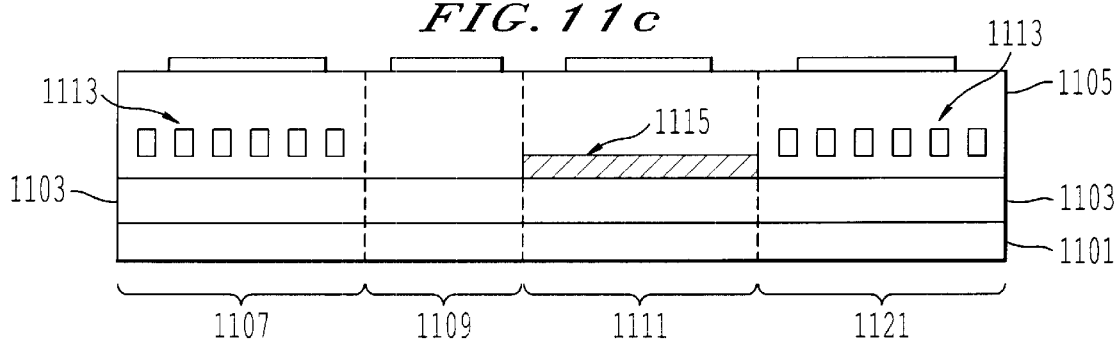

FIGS. 11a through 11c illustrate a conventional DBR laser for which the present embodiment may be applied. As seen in FIG. 11A, the DBR laser device includes a substrate layer 1101, a waveguide layer 1103, 1105. The device is divided into a DBR region 1107, a phase adjustment region 1109, and an active region 1111. As seen in FIG. 11A, a grating 1113 is included within the DBR region 1107 and active material 1115 is included in the active region 1111. The grating material may be constructed of a material having an appropriate band gap wavelength to provide the selective absorption properties of the present invention.

In addition, as shown in FIG. 11B, a selective absorption layer 1117 may be used in the DBR laser to provide selective absorption properties as previously discussed. While the selective absorption layer 1117 is shown in the active region 1111, the selective absorption properties of the present invention may be achieved by placement of the selective absorption layer in the phase adjustment region 1109 or the DBR region 1107. Moreover, the selective absorption layer 1117 may provide selective absorption properties alone, or in combination with a selective absorption grating 1113.

As seen in FIG. 11C, the DBR laser may be configured to have a rear DBR region 1107 and a front DBR region 1121 each including a grating 1113. As is understood by one of ordinary skill in the art, either, or both of the gratings 1113 shown in FIG. 11C can be made of the appropriate material to provide the selective absorption properties of the present invention. Alternatively, in the embodiment of FIG. 11C, the gratings may be constructed of a conventional material and a selective absorption layer may be provided to achieve the selective absorption properties of the present invention.

Figure 12A:
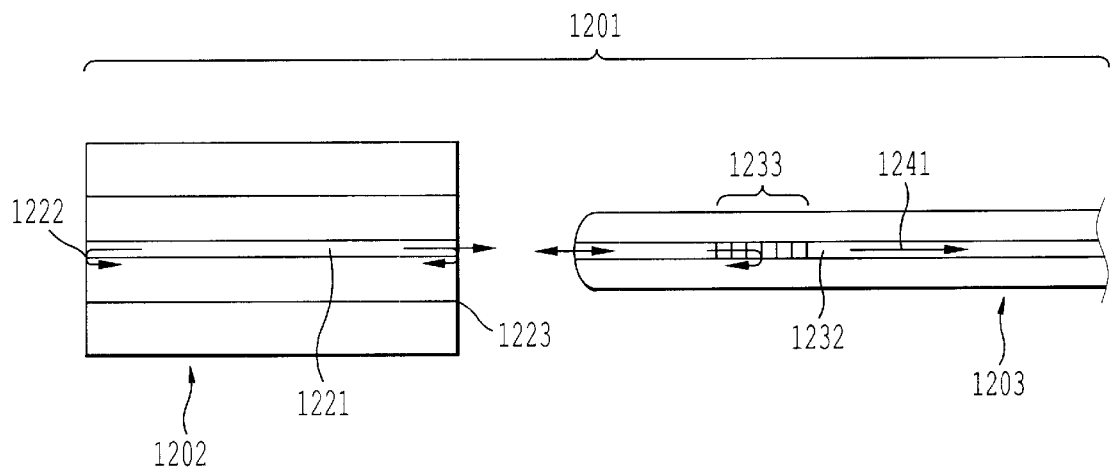
FIG. 12a is an illustration of an external fiber grating laser module for which the present invention may be applied.

FIG. 12a is an illustration showing a general configuration of a conventional fiber grating semiconductor laser module for which the present invention may be applied. As seen in FIG. 12, semiconductor laser module 1201 includes a semiconductor light-emitting element (laser diode) 1202 and an optical fiber 1203. The semiconductor light-emitting element 1202 has an active layer 1221 provided with a light reflecting surface 1222 at one end thereof, and a light irradiating surface 1223 at the other end. Light beams generated inside the active layer 1221 are reflected on the light reflecting surface 1222 and output from the light irradiating surface 1223.

Optical fiber 1203 is disposed on the light irradiating surface 1223 of the semiconductor light-emitting element 1202, and is optically coupled with the light irradiating surface 1223. Fiber grating 1233 is formed at a position of a predetermined distance from the light irradiating surface 1223 in a core 1232 of the optical fiber 1203, and the fiber grating 1233 selectively reflects light beams of a specific wavelength. That is, the fiber grating 1233 functions as an external resonator between the fiber grating 1233 and the light reflecting surface 1222, and selects and amplifies a laser beam of a specific wavelength which is then output as an output laser beam 1241. While not shown in FIG. 12, the present invention may be applied to the diffraction grating device of FIG. 12 by applying a selective absorption layer such as a quantized layer in the vicinity of the active layer 1221 as described above. Moreover, the selective grating of the present invention may be used in combination with the fiber grating of FIG. 12 to provide selective absorption properties as previously described.

Figure 12B:
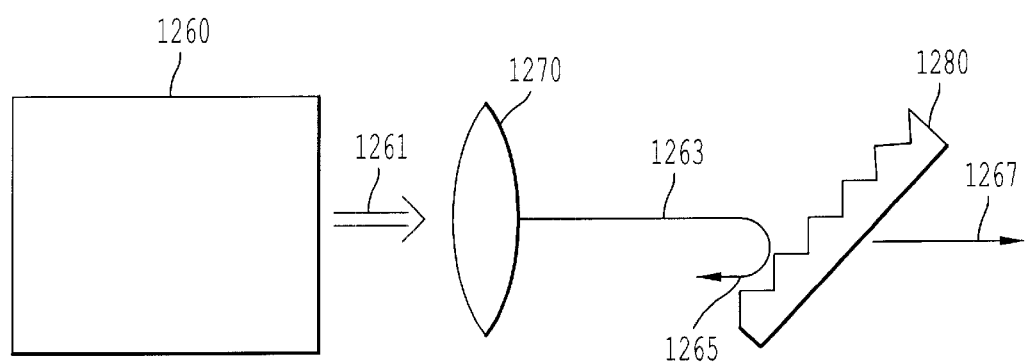
FIG. 12b is a schematic illustration of a general laser system having a wavelength selecting structure, for which the present invention may be applied.

In addition to the fiber grating laser system of FIG. 12a, the selective absorption properties of the selective absorption layer and the selective grating may be applied to any laser system having a laser device and wavelength selecting structure. FIG. 12b is an illustration showing a general configuration of a laser system having a laser device and wavelength selecting structure, for which the present invention may be applied. As seen in this figure, a laser device 1260 is provided for emitting light 1261 which is directed to a lens 1270. The lens 1270 focuses or otherwise shapes the emitted light 1261 into a light beam 1263 which is then sent to a wavelength selection device 1280. The wavelength selection device 1270 may be an etalon, monochormater, dielectric filter, or any other known wavelength selecting structure. As seen in the figure, wavelength selectivity is provided by absorbing or reflecting a portion 1265 of the light beam 1263, and passing a selected portion of the emitted light as an output beam 1267. The present invention may be applied to the system of FIG. 12 by applying a selective absorption layer such as a quantized layer in the vicinity of an active layer of the semiconductor device 1260 as described above. Moreover, the selective grating of the present invention may be used in combination with wavelength selection device 1270 of FIG. 12b to provide selective absorption properties as also previously described.

Figure 12C:
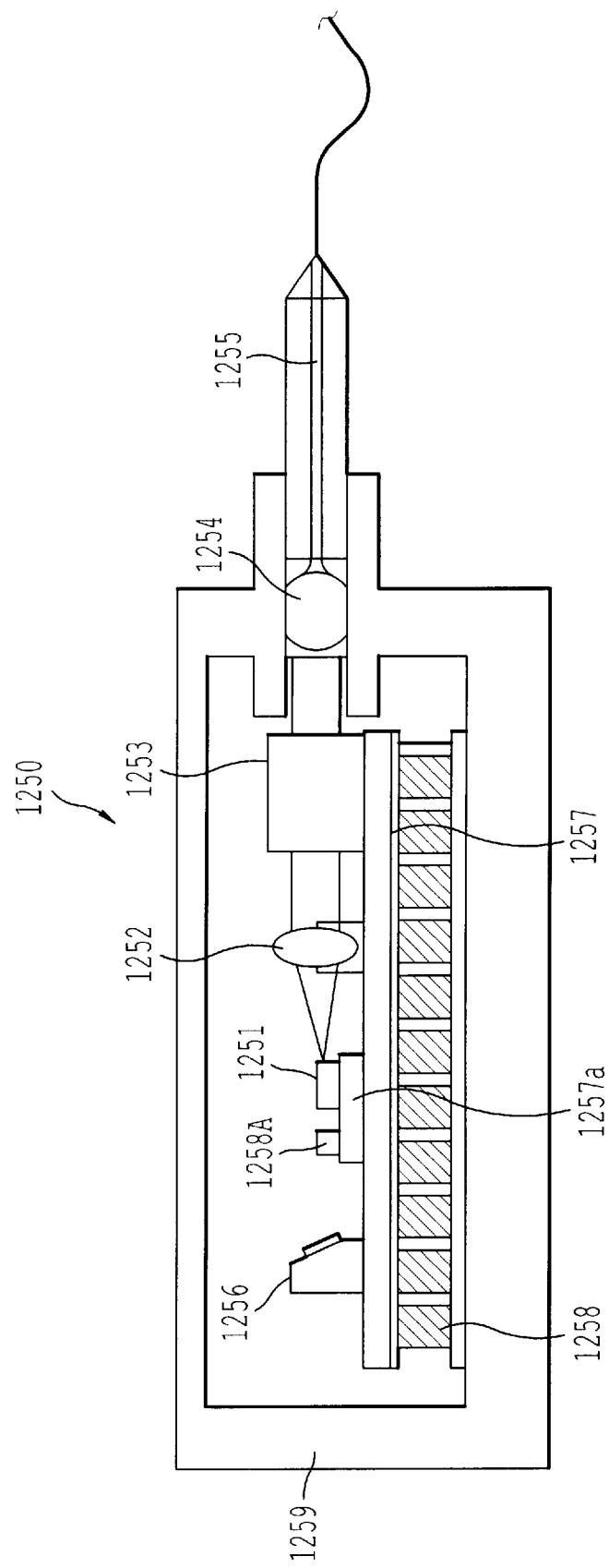
FIG. 12c is a vertical sectional view illustrating the configuration of a semiconductor laser module having a semiconductor laser device according to the present invention.
Figure 13:
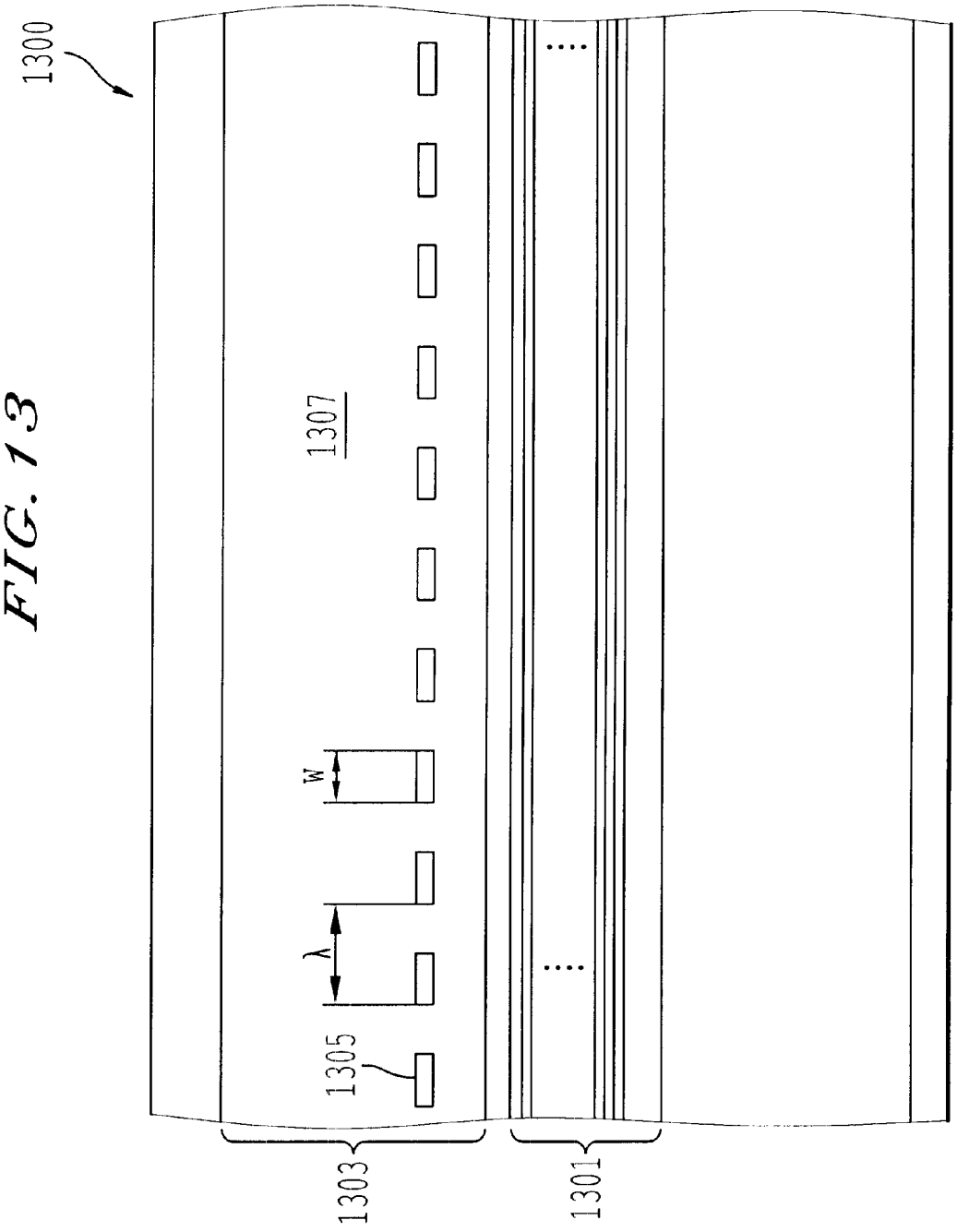
FIG. 13 is a cross section view of a conventional DFB laser device.

FIG. 12c is a vertical sectional view illustrating the configuration of a semiconductor laser module having a semiconductor laser device according to the present invention. The semiconductor laser module 1250 includes a semiconductor laser device 1251, a first lens 1252, an internal isolator 1253, a second lens 1254 and an optical fiber 1255. Semiconductor laser device 1251 is a device configured in accordance with any of the above-described semiconductor laser devices and a laser beam irradiated from the semiconductor laser device 1251 is guided to optical fiber 1255 via first lens 1252, isolator 1253, and second lens 1254. The second lens 1254 is provided on the optical axis of the laser beam and is optically coupled with the optical fiber 1255.

A back face monitor photo diode 1256 is disposed on a base 1257 which functions as a heat sink and is attached to a temperature control device 1258 mounted on the metal package 1259 of the laser module 1250. The back face monitor photo diode 1256 detects a light leakage from the reflection coating side of the semiconductor laser device 1251. The temperature control device 1258 is a Peltier module. Although current (not shown) is given to the Peltier module 1258 to perform cooling and heating by its polarity, the Peltier module 1258 functions mainly as a cooler in order to prevent an oscillation wavelength shift by the increase of temperature of the semiconductor laser device 1251. That is, if a laser beam has a longer wavelength compared with a desired wavelength, the Peltier element 1258 cools the semiconductor laser device 1251 and controls it at a low temperature, and if a laser beam has a shorter wavelength compared with a desired wavelength, the Peltier element 1258 heats the semiconductor laser device 1251 and controls it at a high temperature. By performing such a temperature control, the wavelength stability of the semiconductor laser device can improved. Alternatively, a thermistor 1258a can be used to control the characteristics of the laser device. If the temperature of the laser device measured by a thermistor 1258a located in the vicinity of the laser device 1251 is higher, the Peltier module 1258 cools the semiconductor laser device 1251, and if the temperature is lower, the Peltier module 1258 heats the semiconductor laser device 1251. By performing such a temperature control, the wavelength and the output power intensity of the semiconductor laser device are stabilized.

Obviously, numerous modifications and variations of the present invention are possible in light of the above teachings. It is therefore to be understood that within the scope of the appended claims, the invention may be practiced otherwise than as specifically described herein.

What is claimed is:

1. A semiconductor laser device comprising:

a semiconductor substrate;

an active region formed on said semiconductor substrate and configured to radiate light having a predetermined wavelength range;

a resonator configured to oscillate said light;

a wavelength selecting structure positioned within said resonator and configured to select a first portion of said radiated light for emitting from said semiconductor laser device; and an absorption region located in a vicinity of said active region and configured to selectively absorb a second portion of said radiated light, wherein said first portion of said radiated light has a different wavelength than said second portion of said radiated light.

2. The semiconductor laser device of claim 1, wherein said first portion of said radiated light is a single mode lasing wavelength $\lambda e$ and said second portion of said radiated light is a peak wavelength $\lambda max$ of an optical gain distribution of said active region.

3. The semiconductor laser device of claim 2, wherein said absorption region is configured to provide operational characteristics satisfying the relationship:

$$0 < \lambda e - \lambda abs \leq 100 \text{ nm},$$

where $\lambda abs$ is the bandgap wavelength of the absorption region, and
   $\lambda e$ is the single mode lasing wavelength.

4. The semiconductor laser device of claim 3, wherein said absorption region is configured to provide operational characteristics satisfying the relationship:

$$0 < \lambda e - \lambda abs \leq 70 \text{ nm}.$$

5. The semiconductor laser device of claim 4, wherein said absorption region is configured to provide operational characteristics satisfying the relationship:

$$\lambda e - \lambda abs = 50 \text{ nm}.$$

6. The semiconductor laser device of claim 2, wherein said absorption region is configured to provide operational characteristics satisfying the relationship:

$$\alpha max > \alpha e,$$

where $\alpha max$ is an absorption coefficient with respect to the peak wavelength $\lambda max$ of the optical gain distribution of the active region, and
   $\alpha e$ is an absorption coefficient with respect to said selected lasing wavelength $\lambda e$.

7. The semiconductor laser device of claim 6, wherein said absorption region is configured to provide operational characteristics satisfying the relationship:

$$\alpha max - \alpha e \geq 1 \text{ cm}^{-1},$$

in terms of waveguide loss.

8. The semiconductor laser device of claim 7, wherein said absorption region is configured to provide operational characteristics satisfying the relationship:

$$\alpha max - \alpha e \geq 5 \text{ cm}^{-1},$$

in terms of waveguide loss.

9. The semiconductor laser device of claim 6, wherein said absorption region is configured such that the absorption coefficient $\alpha e$ is substantially 0.

10. The semiconductor laser device of claim 2, wherein said active region, wavelength selecting structure, and absorption region are configured to provide operational characteristics satisfying the relationship:

$$\lambda abs < \lambda max < \lambda e,$$

where $\lambda abs$ is the bandgap wavelength of the absorption region,
    $\lambda max$ is the peak wavelength of an optical gain distribution of said active region, and
    $\lambda e$ is the single mode lasing wavelength.

11. The semiconductor laser device of claim 2, wherein said active region, wavelength selecting structure, and absorption region are configured to provide operational characteristics satisfying the relationship:

$$\lambda max < \lambda abs < \lambda e,$$

where $\lambda max$ is the peak wavelength of an optical gain distribution of said active region;
    $\lambda abs$ is the bandgap wavelength of the absorption region, and
    $\lambda e$ is the single mode lasing wavelength.

12. The semiconductor laser device of claim 2, wherein said active region and absorption region are configured to provide operational characteristics such that $\lambda abs - \lambda max$ ranges from approximately 10 nm to approximately 20 nm.

13. The semiconductor laser device of claim 1, wherein said wavelength selecting structure comprises an external fiber grating.

14. The semiconductor laser device of claim 1, wherein said wavelength selecting structure comprises a distributed Bragg reflector.

15. The semiconductor laser device of claim 1, wherein said wavelength selecting structure comprises an integrated diffraction grating formed on said active region.

16. The semiconductor laser device of claim 15, wherein said integrated diffraction grating comprises a group of periodically spaced parallel rows of grating material surrounded by a cladding layer to form a compound semiconductor layer that periodically differs in refractive index from its surroundings.

17. The semiconductor laser device of claim 16, wherein said integrated diffraction grating functions as said absorption region and is configured to provide operational characteristics having the relationship:

$$0 < \lambda e - \lambda g \leq 100 \text{ nm},$$

where $\lambda g$ is the bandgap wavelength of the diffraction grating, and $\lambda e$ is the single mode lasing wavelength.

18. The semiconductor laser device of claim 17, wherein said integrated diffraction grating is configured to provide operational characteristics having the relationship:

$$0 < \lambda e - \lambda g > 70 \text{ nm}.$$

19. The semiconductor laser device of claim 18, wherein said integrated diffraction grating functions as said absorption region and is configured to provide operational characteristics having the relationship:

$$0 \leq \lambda e - \lambda g = 50 \text{ nm}.$$

20. The semiconductor laser device of claim 16, wherein said diffraction grating is configured to provide operational characteristics satisfying the relationship:

$$\alpha max > \alpha e,$$

where $\alpha max$ is an absorption coefficient with respect to the peak wavelength $\lambda max$ of the optical gain distribution of the active region, and $\alpha e$ is an absorption coefficient with respect to said selected lasing wavelength $\lambda e$.

21. The semiconductor laser device of claim 16, wherein said diffraction grating is configured to provide operational characteristics satisfying the relationship:

$$\alpha max - \alpha e \geq 1 \text{ cm}^{-1},$$

in terms of waveguide loss.

22. The semiconductor laser device of claim 21, wherein said diffraction grating is configured to provide operational characteristics satisfying the relationship:

$$\alpha max - \alpha e \geq 5 \text{ cm}^{-1},$$

in terms of waveguide loss.

23. The semiconductor laser device of claim 20, wherein said absorption region is configured such that $\alpha e = 0$.

24. The semiconductor laser device of claim 21, wherein said active region and diffraction grating are configured to provide operational characteristics satisfying the relationship:

$$\lambda g < \lambda max < \lambda e,$$

where $\lambda g$ is the bandgap wavelength of the diffraction grating, $\lambda max$ is the peak wavelength of an optical gain distribution of said active region, and $\lambda e$ is the single mode lasing wavelength.

25. The semiconductor laser device of claim 21, wherein said active region and diffraction grating are configured to provide operational characteristics satisfying the relationship:

$$\lambda max < \lambda g < \lambda e,$$

where $\lambda max$ is the peak wavelength of an optical gain distribution of said active region;

$\lambda g$ is the bandgap wavelength of the diffraction grating, and $\lambda e$ is the single mode lasing wavelength.

26. The semiconductor laser device of claim 21, wherein said group of periodically spaced parallel rows of grating material extends along a portion of the entire length of said active region on which the diffraction grating is formed.

27. The semiconductor laser device of claim 21, wherein said group of periodically spaced parallel rows of grating material extends along the entire length of said active region on which the diffraction grating is formed.

28. The semiconductor laser device of claim 16, wherein said grating material comprises GaInAsP.

29. The semiconductor laser device of claim 16, wherein said cladding material comprises InP.

30. The semiconductor laser device of claim 1, wherein said absorption region comprises a selective absorption semiconductor layer.

31. The semiconductor laser device of claim 30, wherein said selective absorption semiconductor layer is configured to provide operational characteristics having the relationship:

$$0 < \lambda e - \lambda sel \leq 100 \text{ nm},$$

where $\lambda sel$ is the bandgap wavelength of the selective absorption layer, and $\lambda e$ is the single mode lasing wavelength.

32. The semiconductor laser device of claim 30, wherein said selective absorption layer is configured to provide operational characteristics satisfying the relationship:

$$\alpha max > \alpha e,$$

where $\alpha max$ is an absorption coefficient with respect to the peak wavelength $\lambda max$ of the optical gain distribution of the active region, and $\alpha e$ is an absorption coefficient with respect to said selected lasing wavelength $\lambda e$.

33. The semiconductor laser device of claim 32, wherein said selective absorption layer is configured to provide operational characteristics satisfying the relationship:

$$\alpha max - \alpha e \geq 1 \text{ cm}^{-1},$$

in terms of waveguide loss.

34. The semiconductor laser device of claim 32, wherein said selective absorption layer is configured to provide operational characteristics satisfying the relationship:

$$\alpha max - \alpha e \geq 5 \text{ cm}^{-1},$$

in terms of waveguide loss.

35. The semiconductor laser device of claim 32, wherein said selective absorption layer is configured such that $\alpha e = 0$.

36. The semiconductor laser device of claim 30, wherein said active region, wavelength selecting layer, and selective absorption layer are configured to provide operational characteristics satisfying the relationship:

$$\lambda sel < \lambda max < \lambda e,$$

where $\lambda sel$ is the bandgap wavelength of the selective absorption layer, $\lambda max$ is the peak wavelength of an optical gain distribution of said active region, and $\lambda e$ is the single mode lasing wavelength.

37. The semiconductor laser device of claim 30, wherein said active region, wavelength selecting layer, and selective absorption layer are configured to provide operational characteristics satisfying the relationship:

$$\lambda max<\lambda sel<\lambda e,$$

where $\lambda max$ is the peak wavelength of an optical gain distribution of said active region;

$\lambda sel$ is the bandgap wavelength of the selective absorption layer, and $\lambda e$ is the single mode lasing wavelength.

38. The semiconductor laser device of claim 30, wherein said selective absorption layer is a quantized layer with a thickness small enough to develop a quantum effect.

39. The semiconductor laser device of claim 38, wherein said selective absorption layer has a thickness of approximately 5 nm.

40. The semiconductor laser device of claim 30, wherein said selective absorption semiconductor layer comprises InGaAs.

41. The semiconductor laser device of claim 2, wherein said single mode lasing wavelength $\lambda e$ is greater than said peak wavelength $\lambda max$ of the optical gain distribution of the active region.

42. The semiconductor laser device of claim 2, wherein said single mode lasing wavelength $\lambda e$ is less than said peak wavelength $\lambda max$ of the optical gain distribution of the active region.

43. The semiconductor laser device of claim 2, wherein an absolute value of a detuning amount is at least 20 nm.

44. The semiconductor laser device of claim 2, wherein the laser device has a threshold current of no greater than 9 mA.

45. The semiconductor laser device of claim 1, wherein said first portion of said radiated light includes multiple oscillation wavelengths.

46. The semiconductor laser device of claim 2 wherein said absorption region comprises:

a diffracation grating; and a selective absorption layer mode of a quantized structure.

47. The semiconductor laser device of claim 46 wherein said diffraction grating selectively absorbs wavelengths shorter than said lasing wavelength $\lambda e$, and said selective absorption layer selectively absorbs wavelengths longer than said lasing wavelength $\lambda e$.

48. A method of providing laser light from a semiconductor laser system comprising:

radiating light having a predetermined wavelength range from a semiconductor laser device;

oscillating said light within a resonator of said semiconductor laser device;

selecting a first portion of said radiated light for emitting from said laser system; and selectively absorbing a second portion of said radiated light, wherein said first portion of said radiated light has a different wavelength than said second portion of said radiated light.

49. The method of claim 48, wherein:

said selecting a first portion of the radiated light comprises selecting a single mode lasing wavelength $\lambda e$, and said selectively absorbing a second portion of the radiated light comprises selectively absorbing a peak wavelength $\lambda max$ of an optical gain distribution of said laserdevice.

50. The method of claim 49, wherein said step of selectively absorbing satisfies the relationship:

$$0<\lambda e-\lambda abs \leq 100 \text{ nm},$$

where $\lambda abs$ is a bandgap wavelength of an absorption region of the semiconductor laser device, and $\lambda e$ is the single mode lasing wavelength.

51. The method of claim 50, wherein said step of selectively absorbing satisfies the relationship:

$$0<\lambda e-\lambda abs \leq 70 \text{ nm}.$$

52. The method of claim 51, wherein said step of selectively absorbing satisfies the relationship:

$$\lambda e-\lambda abs = 50 \text{ nm}.$$

53. The method of claim 52, wherein said step of selectively absorbing satisfies the relationship:

$$\alpha max > \alpha e,$$

where $\alpha max$ is an absorption coefficient with respect to the peak wavelength $\lambda max$ of the optical gain distribution of an active region of the laser device, and $\alpha e$ is an absorption coefficient with respect to said selected lasing wavelength $\lambda e$.

54. The method of claim 53, wherein said step of selectively absorbing satisfies the relationship:

$$\alpha max - \alpha e \geq 1 \text{ cm}^{-1},$$

in terms of waveguide loss.

55. The method of claim 54, wherein said step of selectively absorbing satisfies the relationship:

$$\alpha max - \alpha e \geq 5 \text{ cm}^{-1},$$

in terms of waveguide loss.

56. The method of claim 53, wherein said step of selectively absorbing comprises providing the absorption coefficient $\alpha e$ substantially at 0.

57. The method of claim 49, wherein said steps of radiating, selecting, and selectively absorbing further comprise satisfying the following relationship:

$$\lambda abs < \lambda max < \lambda e,$$

where $\lambda abs$ is the bandgap wavelength of an absorption region of the laser device, $\lambda max$ is the peak wavelength of an optical gain distribution of an active region of the laser device, and $\lambda e$ is the single mode lasing wavelength.

58. The method of claim 49, wherein said steps of radiating, selecting, and selectively absorbing further comprise satisfying the following relationship:

$$\lambda max < \lambda abs < \lambda e,$$

where $\lambda max$ is the peak wavelength of an optical gain distribution of and active region of the laser device;

$\lambda abs$ is the bandgap wavelength of an absorption region of the laser device, and $\lambda e$ is the single mode lasing wavelength.

59. The method of claim 49, wherein said step of selectively absorbing further comprising setting the parameter $\lambda abs-\lambda max$ within the range of approximately 10 nm to approximately 20 nm.

60. The method of claim 49, wherein said step of selecting a first portion of the radiated light further comprises selecting the single mode lasing wavelength λe greater than the peak wavelength λmax of the optical gain distribution of an active region of the laser device.

61. The method of claim 49, wherein said step of selecting a first portion of the radiated light further comprises selecting the single mode lasing wavelength λe less than the peak wavelength λmax of the optical gain distribution of an active region of the laser device.

62. The method of claim 49, further comprising setting an absolute value of a detuning amount of the laser system to at least 20 nm.

63. The method of claim 49, further comprising setting a threshold current of the laser device to a value no greater than 9 mA.

64. The method of claim 48, wherein said step of selecting said first portion of said radiated light includes selecting multiple oscillation wavelengths.

65. The method of claim 49, further comprising:
using a diffraction grating to selectively absorb wavelengths shorter than said lasing wavelength λe, and
using a selective absorption layer made of a quantized structure.selectively absorb wavelengths longer than said lasing wavelength λe.

66. A semiconductor laser device comprising:
means for radiating light having a predetermined wavelength;
means for oscillating said light;
means for selecting a first portion of said radiated light for emitting from said laser device said means for selecting being positioned within said means for oscillating; and
means for selectively absorbing a second portion of said radiated light, wherein said first portion of said radiated light has a different wavelength than said second portion of said radiated light.

67. The semiconductor laser device of claim 66, wherein:
said means for selecting a first portion of the radiated light comprises means for selecting a single mode lasing wavelength λe, and
said means for selectively absorbing a second portion of the radiated light comprises means for selectively absorbing a peak wavelength λmax of an optical gain distribution of said laser device.

68. The semiconductor laser device of claim 67, wherein said means for selectively absorbing comprises means for satisfying the relationship:

$$0 < \lambda e - \lambda abs < 100 \text{ nm},$$

where λabs is a bandgap wavelength of an absorption region of the semiconductor laser device, and
λe is the single mode lasing wavelength.

69. The semiconductor laser device claim 67, wherein said means for selectively absorbing comprises means for satisfying the relationship:

$$\alpha max > \alpha e,$$

where αmax is an absorption coefficient with respect to the peak wavelength λmax of the optical gain distribution of an active region of the laser device, and
αe is an absorption coefficient with respect to said selected lasing wavelength λe.

70. The semiconductor laser device of claim 67, wherein said means for selectively absorbing comprises means for satisfying the relationship:

$$\alpha max - \alpha e \geq 1 \text{ cm}^{-1},$$

in terms of waveguide loss.

71. The semiconductor laser device of claim 67, wherein said means for selectively absorbing comprises means for providing the absorption coefficient αe substantially at 0.

72. The semiconductor laser device of claim 67, further comprising means for satisfying the following relationship:

$$\lambda abs < \lambda max < \lambda e,$$

where λabs is the bandgap wavelength of an absorption region of the laser device,
λmax is the peak wavelength of an optical gain distribution of an active region of the laser device, and
λe is the single mode lasing wavelength.

73. The semiconductor laser device of claim 67, further comprising means for satisfying the following relationship:

$$\lambda max < \lambda abs < \lambda e,$$

where λmax is the peak wavelength of an optical gain distribution of and active region of the laser device;
λabs is the bandgap wavelength of an absorption region of the laser device, and
λe is the single mode lasing wavelength.

74. The semiconductor laser device of claim 67, wherein said step of selectively absorbing further comprising setting the parameter λabs–λmax within the range of approximately 10 nm to approximately 20 nm.

75. The semiconductor laser device of claim 67, wherein said means for selecting a first portion of the radiated light comprises means for selecting the single mode lasing wavelength λe greater than the peak wavelength λmax of the optical gain distribution of an active region of the laser device.

76. The semiconductor laser device of claim 67, wherein said means for selecting a first portion of the radiated light comprises means for selecting the single mode lasing wavelength λe less than the peak wavelength λmax of the optical gain distribution of an active region of the laser device.

77. The semiconductor laser device of claim 67, further comprising means for setting an absolute value of a detuning amount of the laser system to at least 20 nm.

78. The semiconductor laser device of claim 67, further comprising means for setting a threshold current of the laser device to a value no greater than 9 mA.

79. The semiconductor laser device of claim 67, wherein said means for selecting said first portion of said radiated light includes means for selecting multiple oscillation wavelengths.

80. A semiconductor laser module comprising:
a semiconductor laser device comprising;
a semiconductor substrate,
an active region formed on said semiconductor substrate and configured to radiate light having a predetermined wavelength range,
a resonator configured to oscillate said light,
a wavelength selecting structure positioned within said resonator and configured to select a first portion of said radiated light for emitting from said semiconductor laser device, and
an absorption region located in a vicinity of said active region and configured to selectively absorb a second portion of said radiated light, wherein said first portion of said radiated light has a different wavelength than said second portion of said radiated light; and a waveguide device for guiding said laser beam away from the semiconductor laser device.

81. An optical fiber amplifier comprising:

a semiconductor laser device comprising;
   a semiconductor substrate;
   an active region formed on said semiconductor substrate and configured to radiate light having a predetermined wavelength range,
   a resonator configured to oscillate said light,
   a wavelength selecting structure positioned within said resonator and configured to select a first portion of said radiated light for emitting from said semiconductor laser device, and
   an absorption region located in a vicinity of said active region and configured to selectively absorb a second portion of said radiated light, wherein said first portion of said radiated light has a different wavelength than said second portion of said radiated light; and
   an amplifying fiber coupled to said semiconductor laser device and configured to amplify a signal by using said laser beam as an excitation light.

82. A wavelength division multiplexing system comprising:

a transmission device configured to provide a plurality of optical signals having different wavelengths;

an optical fiber coupled to said transmission device and including a semiconductor laser device comprising;
   a semiconductor substrate,
   an active region formed on said semiconductor substrate and configured to radiate light having a predetermined wavelength range,
   a resonator configured to oscillate said light,
   a wavelength selecting structure positioned within said resonator and configured to select a first portion of said radiated light for emitting from said semiconductor laser device, and
   an absorption region located in a vicinity of said active region and configured to selectively absorb a second portion of said radiated light, wherein said first portion of said radiated light has a different wavelength than said second portion of said radiated light; and
a receiving device coupled to said optical fiber amplifier and configured to receive said plurality of optical signals having different wavelengths.

83. A Raman amplifier comprising:

a semiconductor laser device comprising;
   a semiconductor substrate,
   an active region formed on said semiconductor substrate and configured to radiate light having a predetermined wavelength range,
   a resonator configured to oscillate said light,
   a wavelength selecting structure positioned within said resonator and configured to select a first portion of said radiated light for emitting from said semiconductor laser device as a laser beam, and
   an absorption region located in a vicinity of said active region and configured to selectively absorb a second portion of said radiated light, wherein said first portion of said radiated light has a different wavelength than said second portion of said radiated light; and
a fiber coupled to said semiconductor laser device and configured to carry a signal that is amplified based on said laser beam being applied to said fiber.

* * * * *

UNITED STATES PATENT AND TRADEMARK OFFICE
CERTIFICATE OF CORRECTION

PATENT NO.    : 6,580,740 B2
DATED         : June 17, 2003
INVENTOR(S)   : Masaki Funabashi et al.

It is certified that error appears in the above-identified patent and that said Letters Patent is hereby corrected as shown below:

Column 3,
Line 8, change "DFB laser is $\lambda e$" to -- the DFB laser is $\alpha e$ --.

Column 4,
Line 53, change "$0 < \lambda e - \lambda abs \leqq 100$ nm; $0 < \lambda e - \lambda abs \leqq 70$ nm" to
-- $0 < \lambda e - \lambda abs \leq 100$ nm; $0 < \lambda e - \lambda abs \leq 70$ nm --

Column 7,
Line 51, change "having a of approximately" to -- having a $\lambda g$ of approximately --

Column 19,
Line 15, change "$0 < \lambda e - \lambda g > 70$ nm." to -- $0 < \lambda e - \lambda g \leq 70$ nm. --
Line 21, change "$0 \leqq \lambda e - \lambda g = 50$ nm." to -- $0 < \lambda e - \lambda g = 50$ nm. --

Column 23,
Line 51, change "$0 < \lambda e - \lambda abs < 100$ nm," to -- $0 < \lambda e - \lambda\, abs \leq 100$ nm, --

Column 24,
Line 65, change "laser device, and" to -- laser device as a laser beam, and --

Column 25,
Line 17, change "laser device, and" to -- laser device as a laser beam, and --

Signed and Sealed this

Twenty-seventh Day of July, 2004

JON W. DUDAS
*Acting Director of the United States Patent and Trademark Office*